(12) United States Patent
Heil et al.

(10) Patent No.: US 9,017,825 B2
(45) Date of Patent: *Apr. 28, 2015

(54) ANTHRACENE DERIVATIVES AND THEIR USE IN ORGANIC ELECTROLUMINESCENT DEVICES

(75) Inventors: Holger Heil, Darmstadt (DE); Arne Buesing, Frankfurt am Main (DE); Philipp Stoessel, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 977 days.

This patent is subject to a terminal disclaimer.

(21) Appl. No.: 12/096,536

(22) PCT Filed: Dec. 7, 2006

(86) PCT No.: PCT/EP2006/011758
§ 371 (c)(1),
(2), (4) Date: Jun. 6, 2008

(87) PCT Pub. No.: WO2007/065678
PCT Pub. Date: Jun. 14, 2007

(65) Prior Publication Data
US 2008/0303423 A1    Dec. 11, 2008

(30) Foreign Application Priority Data
Dec. 8, 2005  (DE) .................... 10 2005 058 557

(51) Int. Cl.
| | | |
|---|---|---|
| H01L 51/54 | (2006.01) | |
| C09K 11/06 | (2006.01) | |
| H01L 51/00 | (2006.01) | |
| H05B 33/14 | (2006.01) | |
| H01L 51/50 | (2006.01) | |

(52) U.S. Cl.
CPC ............ *H01L 51/0059* (2013.01); *C09K 11/06* (2013.01); *C09K 2211/1011* (2013.01); *C09K 2211/1014* (2013.01); *H01L 51/0058* (2013.01); *H01L 51/006* (2013.01); *H01L 51/0061* (2013.01); *H01L 51/0072* (2013.01); *H01L 51/0073* (2013.01); *H01L 51/0074* (2013.01); *H01L 51/0094* (2013.01); *H01L 51/5012* (2013.01); *H05B 33/14* (2013.01); *Y02E 10/549* (2013.01); *Y10S 428/917* (2013.01)

(58) Field of Classification Search
None
See application file for complete search history.

(56) References Cited

U.S. PATENT DOCUMENTS

| | | | |
|---|---|---|---|
| 4,539,507 A | 9/1985 | VanSlyke et al. | |
| 5,151,629 A | 9/1992 | VanSlyke | |
| 5,840,217 A | 11/1998 | Lupo et al. | |
| 6,458,909 B1 | 10/2002 | Spreitzer et al. | |
| 6,534,199 B1 * | 3/2003 | Hosokawa et al. | 428/690 |
| 2002/0048687 A1 * | 4/2002 | Hosokawa et al. | 428/690 |
| 2003/0087126 A1 * | 5/2003 | Ishida et al. | 428/690 |
| 2003/0111692 A1 | 6/2003 | Toguchi et al. | |
| 2004/0263067 A1 | 12/2004 | Saitoh et al. | |
| 2004/0265632 A1 * | 12/2004 | Okinaka et al. | 428/690 |
| 2006/0063027 A1 | 3/2006 | Vestweber et al. | |
| 2006/0175958 A1 | 8/2006 | Gerhard et al. | |
| 2006/0220004 A1 | 10/2006 | Stossel et al. | |
| 2006/0222888 A1 | 10/2006 | Lee et al. | |
| 2007/0164273 A1 | 7/2007 | Gerhard et al. | |
| 2007/0170419 A1 | 7/2007 | Gerhard et al. | |
| 2011/0034744 A1 | 2/2011 | Ikeda et al. | |

FOREIGN PATENT DOCUMENTS

| | | |
|---|---|---|
| EP | 0676461 A2 | 10/1995 |
| EP | 0681019 A2 | 11/1995 |
| EP | 1167488 A1 | 1/2002 |
| EP | 1182183 A1 | 2/2002 |
| EP | 1221434 A1 | 7/2002 |
| EP | 1553154 A1 | 7/2005 |
| EP | 1717875 A1 | 11/2006 |
| JP | 8-012600 A | 1/1996 |
| JP | 11-111460 | 4/1999 |
| JP | 2000-007640 | 1/2000 |
| JP | 2000007604 A | 1/2000 |
| JP | 2003-115624 A | 4/2003 |
| JP | 2004-002351 | 1/2004 |
| JP | 2005-008587 | 1/2005 |
| JP | 2005-015418 A | 1/2005 |
| JP | 2006-287218 A | 10/2006 |
| JP | 2006-287248 | 10/2006 |
| WO | WO-98/27136 A1 | 6/1998 |
| WO | WO-01/21729 A1 | 3/2001 |
| WO | WO-01/72673 A1 | 10/2001 |
| WO | WO-2004/018587 A1 | 3/2004 |
| WO | WO-2004/058911 A2 | 7/2004 |
| WO | WO-2004/081017 A1 | 9/2004 |
| WO | WO-2005/011013 A1 | 2/2005 |
| WO | WO-2005/084081 A1 | 9/2005 |
| WO | WO-2005/084082 A1 | 9/2005 |
| WO | WO-2006/000388 A1 | 1/2006 |
| WO | WO-2006/000389 A1 | 1/2006 |
| WO | WO-2006/048268 A1 | 5/2006 |
| WO | WO-2006/058737 A1 | 6/2006 |
| WO | WO-2006/117052 A1 | 11/2006 |

OTHER PUBLICATIONS

Baumgarten et al. Angew. Chem. Int. Ed. Engl. 1992, 31, 448-451. Year of publication: 1992.*
Baumgarten et al., "Synthesis and optical properties of novel blue fluorescent conjugated polymer", Phys. Chem. Chem. Phys., vol. 1, pp. 1699-1706, 1999.

* cited by examiner

*Primary Examiner* — Andrew K Bohaty
(74) *Attorney, Agent, or Firm* — Drinker Biddle & Reath LLP

(57) ABSTRACT

The present invention relates to anthracene derivatives which are suitable for use in organic electroluminescent devices, and to organic electroluminescent devices containing these anthracene derivatives.

12 Claims, No Drawings

ANTHRACENE DERIVATIVES AND THEIR USE IN ORGANIC ELECTROLUMINESCENT DEVICES

RELATED APPLICATIONS

This application is a national stage application (under 35 U.S.C. §371) of PCT/EP2006/011758, filed Dec. 7, 2006, which claims benefit of Germany application 10 2005 058 557.4, filed Dec. 8, 2005.

The present invention relates to novel materials for organic electroluminescent devices, to the use thereof, and to organic electroluminescent devices containing these materials.

The general structure of organic electroluminescent devices which are capable of the emission of light in the visible spectral region and which contain semiconducting organic compounds is described, for example, in U.S. Pat. No. 4,539,507, U.S. Pat. No. 5,151,629, EP 0676461 and WO 98/27136.

However, these devices still exhibit considerable problems which require urgent improvement for use in high-quality full-colour displays:
1. The operating lifetime is still short, in particular in the case of blue emission, meaning that it has hitherto only been possible to achieve simple applications commercially.
2. The efficiency is also still inadequate, in particular in the case of blue emission, and must be improved further for high-quality applications.
3. Some compounds which are used as host materials for blue-emitting electroluminescent devices tend towards crystallisation during vapour deposition instead of the formation of glass-like films and do not have an adequately high glass-transition temperature. Further improvements are necessary here.

The object of the present invention was therefore to offer improvements for this purpose, in particular compounds which result in improved efficiency and an improved lifetime in organic electroluminescent devices. The object of the present invention was furthermore to provide compounds which have a higher glass-transition temperature and a lower crystallisation tendency.

Phenylanthracene derivatives in which two phenylanthracene groups are linked via a divalent group are known from the prior art (EP 0681019). The divalent groups disclosed are single bonds and arylene groups, in particular phenylene groups and phenylene groups which are interrupted by an alkylene group, —O—, —S— or —NR—. It is not evident from this application that other divalent groups could be particularly suitable for linking the two anthracenes. It is equally unclear from this application that anthracene derivatives which contain other groups bonded instead of the phenyl group could be particularly suitable. The prior art furthermore discloses dimeric anthracene derivatives of the formula anthracene-X-anthracene, where X represents a heterocyclic compound having at least two rings (JP 2004/002351). It is not evident from this application that anthracene derivatives of this type which contain a heteroaryl group bonded in the 9- and 9'-positions are particularly suitable.

EP 1221434 discloses compounds in which two anthracene units are linked via a fluorene unit. Inter alia, a compound is also disclosed which additionally contains a pyridine group in each of the 9- and 9'-positions of the two anthracene units. However, this document teaches that the fluorene unit is necessary in order to achieve particularly good results in organic electroluminescent devices.

Surprisingly, it has been found that certain anthracene derivatives described below have significant improvements compared with the prior art described above. By means of these compounds, higher efficiencies and improved lifetimes can be obtained. In addition, these compounds have a lower crystallisation tendency and a higher glass-transition temperature than compounds in accordance with the prior art. The present invention therefore relates to these compounds and to the use thereof in OLEDs.

The invention relates to compounds of the formula (1)

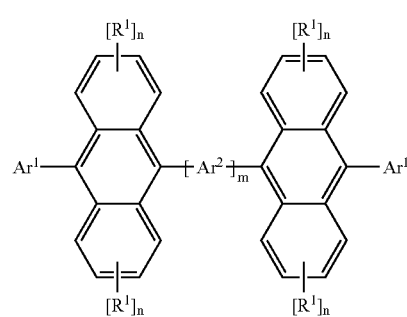

Formula (1)

where the following applies to the symbols and indices used:
Ar$^1$ is, identically or differently on each occurrence, an aromatic or heteroaromatic ring system having 5 to 30 aromatic ring atoms, which may be substituted by one or more radicals R$^1$;
Ar$^2$ is, if both groups Ar$^1$ represent an aromatic ring system, a group of the formula (2)

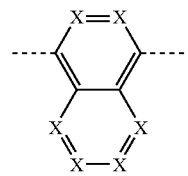

Formula (2)

where X, identically or differently on each occurrence, stands for CR$^1$ or N,
or
is, if at least one group Ar$^1$ represents a heteroaromatic ring system, identically or differently on each occurrence, an aryl or heteroaryl group having 5 to 20 aromatic ring atoms, which may be substituted by one or more radicals R$^1$;
R$^1$ is, identically or differently on each occurrence, H, F, Cl, Br, I, CN, NO$_2$, N(R$^2$)$_2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R$^2$, where one or more non-adjacent CH$_2$ groups may be replaced by —R$^2$C═CR$^2$—, —C≡C—, Ge(R$^2$)$_2$, Sn(R$^2$)$_2$, C═O, C═S, C═Se, C═NR$^2$, —O—, —S—, —N(R$^2$)— or —CONR$^2$— and where one or more H atoms may be replaced by F, Cl, Br, I, CN or NO$_2$, or an aryl or heteroaryl group having 5 to 30 aromatic ring atoms, which may be substituted by one or more radicals R$^2$, or an aryloxy or heteroaryloxy group having 5 to 24 aromatic ring atoms, which may be substituted by one or more radicals R², or a combination of two, three, four or five of these systems; two or more adjacent substituents R¹ here may also form a mono- or polycyclic, aliphatic ring system with one another;

R² is on each occurrence, identically or differently, H or a hydrocarbon radical having 1 to 20 C atoms, which may be aliphatic, aromatic or a combination of aliphatic and aromatic and in which one or more H atoms may be replaced by F; two or more radicals R here may also form a mono- or polycyclic, aliphatic or aromatic ring system with one another;

n is, identically or differently on each occurrence, 0, 1, 2, 3 or 4;

m is 1, 2, 3, 4 or 5.

For the purposes of this invention, a cyclic alkyl group is taken to mean both monocyclic and also bi- and polycyclic alkyl groups.

For the purposes of this invention, adjacent substituents are taken to mean substituents which are bonded to directly adjacent C atoms, i.e. to C atoms which have a direct bond.

For the purposes of this invention, an aryl group or heteroaryl group is taken to mean an aromatic group or heteroaromatic group having a common aromatic π-electron system. For the purposes of this invention, this may be a simple homo- or heterocycle, for example benzene, pyridine, thiophene, etc., or it may be a condensed aromatic ring system, in which at least two aromatic or heteroaromatic rings, for example benzene rings, are "fused" to one another, i.e. are condensed onto one another by anellation, i.e. have at least one common edge and consequently also a common aromatic π-electron system. These aryl or heteroaryl groups may be substituted or unsubstituted. Thus, for example, systems such as naphthalene, anthracene, phenanthrene, pyrene, etc., are to be regarded as aryl groups and quinoline, acridine, benzothiophene, carbazole, etc., as heteroaryl groups for the purposes of this invention, while, for example, biphenyl, fluorene, spirobifluorene, etc., do not represent aryl groups since they involve separate aromatic electron systems.

For the purposes of this invention, an aromatic ring system contains 6 to 30 C atoms in the ring system. For the purposes of this invention, a heteroaromatic ring system contains 2 to 30 C atoms and at least one heteroatom in the ring system, with the proviso that the total number of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (less than 10% of the atoms other than H, preferably less than 5% of the atoms other than H), such as, for example, an sp³-hybridised C, N or O atom. Thus, for example, systems such as 9,9'-spirobifluorene, fluorene, triarylamine, diaryl ethers, etc., are also intended to be taken to mean aromatic ring systems for the purposes of this invention. Part of the aromatic or heteroaromatic ring system here may also be a condensed group.

For the purposes of the present invention, a $C_1$- to $C_{40}$-alkyl group, in which, in addition, individual H atoms or CH₂ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{40}$-alkoxy group is particularly preferably taken to mean methoxy, ethoxy, n-propoxy, i-propoxy, n-butoxy, i-butoxy, s-butoxy, t-butoxy or 2-methylbutoxy. An aromatic or heteroaromatic ring system having 1 to 30 aromatic ring atoms, which may also in each case be substituted by the above-mentioned radicals R¹ or R² and which may be linked to the aromatic or heteroaromatic ring via any desired positions, is taken to mean, in particular, groups derived from benzene, naphthalene, anthracene, phenanthrene, pyrene, chrysene, perylene, fluoranthene, tetracene, pentacene, benzopyrene, biphenyl, biphenylene, terphenyl, terphenylene, fluorene, spirobifluorene, truxene, isotruxene, dihydrophenanthrene, dihydropyrene, tetrahydropyrene, cis- or trans-indenofluorene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preferred embodiments of the compounds of the formula (1) are the compounds of the formula (3) or (4)

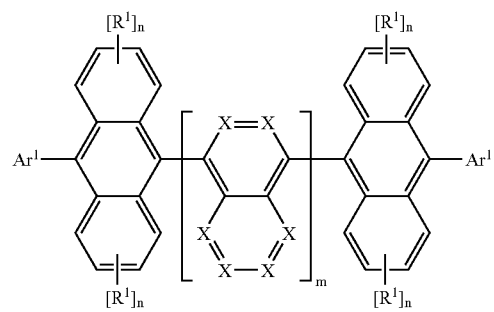

Formula (3)

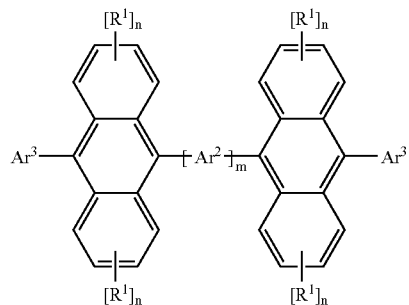

Formula (4)

where Ar³, identically or differently on each occurrence, stands for a heteroaromatic ring system having 5 to 30 aromatic ring atoms, which may be substituted by one or more radicals R¹, and the other symbols and indices have the same meaning as described above.

In a preferred embodiment of the compound of the formula (3), a maximum of two symbols X stand for N and the other symbols X stand for CR¹. Preferred groups Ar², or central units in the compound of the formula (3), are the groups of the following formulae (5) to (10). Of these, particular preference is given to the groups of the formulae (5) and (9), very particularly preferably the group of the formula (5).

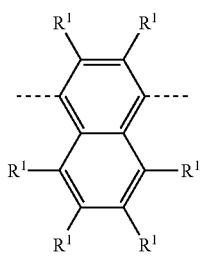

Formula (5)

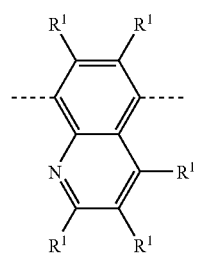

Formula (6)

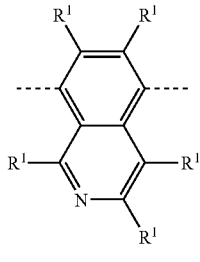

Formula (7)

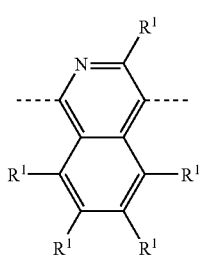

Formula (8)

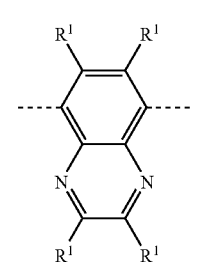

Formula (9)

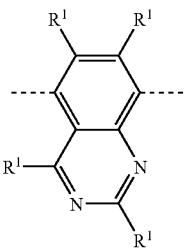

Formula (10)

In another preferred embodiment of the compound of the formula (3), the symbols Ar¹, identically or differently on each occurrence, stand for an aromatic or heteroaromatic ring system having 9 to 25 aromatic ring atoms, which may be substituted by one or more radicals R¹. Particular preference is given to compounds of the formula (3) in which the symbol Ar¹, identically or differently on each occurrence, stands for a condensed aryl or heteroaryl group having 10 to 16 aromatic ring atoms or for an aromatic, optionally bridged biaryl group, each of which may be substituted by one or more radicals R¹. Particular preference is furthermore given to compounds of the formula (3) in which the symbol Ar¹, identically or differently on each occurrence, stands for a 1-naphthyl, 2-naphthyl, 9-anthryl, 2-phenanthrenyl, 9-phenanthrenyl, quinolinyl, isoquinolinyl, thienyl, benzothienyl, dibenzothienyl, furanyl, benzofuranyl, dibenzofuranyl, pyrrolyl, indolyl, carbazolyl, each of which may be linked via C or N, imidazolyl, which may be linked via C or N, benzimidazolyl, which may be linked via C or N, 2-, 3- or 4-pyridyl, pyrazinyl, 2-, 4- or 5-pyrimidinyl, 3- or 4-pyridazinyl, quinolinyl, isoquinolinyl, orthobiphenyl or 2-fluorenyl group, each of which may be substituted by one or more radicals R¹, in particular for 1-naphthyl, 2-naphthyl, 9-phenanthrenyl, thienyl, benzothienyl, carbazolyl, benzimidazolyl, 3-pyridyl, quinolinyl, orthobiphenyl or 2-fluorenyl, each of which may be substituted by one or more radicals R¹. The two groups Ar¹ are preferably identical.

In a preferred embodiment of the compound of the formula (4), the heteroaryl group of the heteroaromatic ring system Ar³ is bonded directly to the anthracene. The symbols Ar³, identically or differently on each occurrence, preferably stand for a heteroaromatic ring system having 5 to 20 aromatic ring atoms, which may be substituted by one or more radicals R¹. Particular preference is given to compounds of the formula (4) in which the symbol Ar³, identically or differently on each occurrence, stands for a heteroaryl group having 5 to 14 aromatic ring atoms, which may be substituted by one or more radicals R¹. Very particular preference is given to compounds of the formula (4) in which the symbol Ar³, identically or differently on each occurrence, stands for a thienyl, benzothienyl, dibenzothienyl, furanyl, benzofuranyl, dibenzofuranyl, pyrrolyl, indolyl or carbazolyl, each of which may be linked via C or N, imidazolyl, which may be linked via C or N, benzimidazolyl, which may be linked via C or N, 2-, 3- or 4-pyridyl, pyrazinyl-, 2-, 4- or 5-pyrimidinyl, 3- or 4-pyridazinyl, quinolinyl or isoquinolinyl group, each of which may be substituted by one or more radicals R¹, in particular for thienyl, benzothienyl, carbazolyl, benzimidazolyl, 3-pyridyl or quinolinyl, each of which may be substituted by one or more radicals R¹. The two groups Ar³ are preferably identical.

In another preferred embodiment of the compound of the formula (4), the symbol Ar², identically or differently on each occurrence, stands for an aryl or heteroaryl group having 5 to 14 aromatic ring atoms, which may be substituted by one or more radicals $R^1$. The symbol $Ar^2$, identically or differently on each occurrence, particularly preferably stands for 1,4-naphthylene, 1,5-naphthylene, 2,6-naphthylene, 1,2-, 1,3- or 1,4-phenylene or 2,7-phenanthrenylene.

Preference is furthermore given to compounds of the formula (1), or of the formula (3) or formula (4), in which the symbol $R^1$, identically or differently on each occurrence, stands for H, F, a straight-chain alkyl or alkoxy group having 1 to 6 C atoms or a branched or cyclic alkyl or alkoxy group having 3 to 10 C atoms, where in each case one or more $CH_2$ groups may be replaced by $-R^2C=CR^2-$, $-O-$, $-S-$ or $-N(R^2)-$ and where in each case one or more H atoms may be replaced by F, or an aryl or heteroaryl group having 5 to 14 aromatic ring atoms, or a combination of two or three of these systems; two or more radicals $R^1$ here may also form a mono- or polycyclic, aliphatic ring system with one another. Particularly preferred radicals $R^1$ are selected from the group consisting of H, F, straight-chain alkyl groups having 1 to 4 C atoms, branched alkyl groups having 3 to 5 C atoms or cyclic alkyl groups having 5 to 10 C atoms, where in each case one or more H atoms may be replaced by F, or aryl or heteroaryl groups having 6 to 10 aromatic ring atoms, or a combination of two of these systems; two or more adjacent radicals $R^1$ here may also form a mono- or polycyclic, aliphatic ring system with one another.

Preference is furthermore given to compounds of the formula (1), or of the formula (3) or formula (4), in which the index n stands for 0, 1 or 2, particularly preferably for 0 or 1, very particularly preferably for 0. If the index n stands for 1, the substituent $R^1$ is preferably bonded in the 2-position and/or in the 6-position of the anthracene.

Preference is furthermore given to compounds of the formula (1), or of the formula (3) or formula (4), in which the index m stands for 1, 2 or 3, particularly preferably for 1 or 2.

Preference is furthermore given to compounds of the formula (1), or of the formula (3) or formula (4), whose molecular weight is between 600 and 2000 g/mol, particularly preferably between 700 and 1500 g/mol.

It should be emphasised here that both compounds of the formula (1), or of the formula (3) or formula (4), in which the two groups $Ar^1$ or the two groups $Ar^3$ are selected to be identical, and also compounds in which the two groups $Ar^1$ or the two groups $Ar^3$ are different, are in accordance with the invention. Preference is given to compounds in which the two groups $Ar^1$ are identical and also identically substituted, or in which the two groups $Ar^3$ are identical and also identically substituted.

Depending on the choice of $Ar^1$, $Ar^2$ and $Ar^3$, the compounds of the formula (1), or of the formula (3) or formula (4), have hindered rotation about one or more bonds (bonds between $Ar^1$ or $Ar^2$ or $Ar^3$ and anthracene) and are thus capable of the formation of atropisomers, i.e. of the formation of stereoisomers which are stable at room temperature. If the compound of the formula (1), or of the formula (3) or formula (4), exhibits atropisomerism about one or more bonds, the invention in each case also relates to the corresponding enriched or isolated atropisomers. This relates both to enantiomers and also to diastereomers. The choice of suitable atropisomers enables, for example, the solubility of the compound, the glass-transition temperature and the electro-optical properties to be influenced. Preference is given to compounds which do not exhibit atropisomerism.

Examples of preferred compounds of the formula (3) are the compounds listed in Table 1 below. Ph stands for a phenyl group. The abbreviations entered in the table stand for the following groups, where the dashed line in each case indicates the link to the anthracene.

TABLE 1

$Ar^1$:

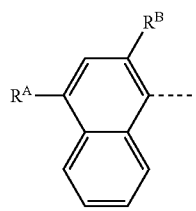

Ar1(A)

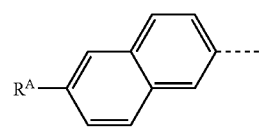

Ar1(B)

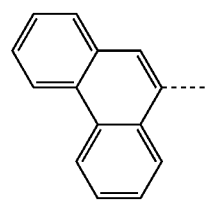

Ar1(C)

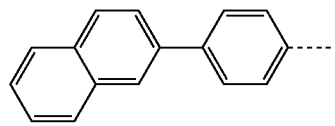

Ar1(D)

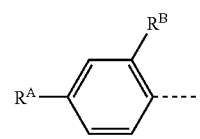

Ar1(E)

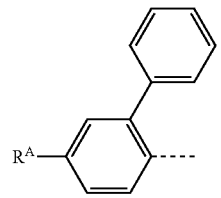

Ar1(F)

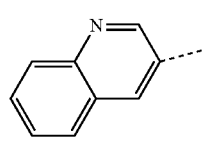

Ar1(G)

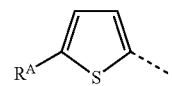

Ar1(H)

TABLE 1-continued

Ar1(I)

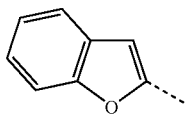

Ar²:

Ar2(A)

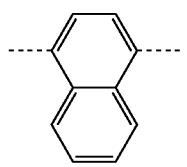

Ar2(B)

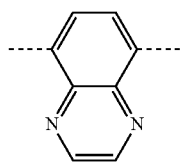

| No. | Ar¹ | Ar² | m | R^A | R^B |
|---|---|---|---|---|---|
| 1 | Ar1(A) | Ar2(A) | 1 | H | H |
| 2 | Ar1(A) | Ar2(A) | 2 | H | H |
| 3 | Ar1(A) | Ar2(B) | 1 | H | H |
| 4 | Ar1(A) | Ar2(B) | 2 | H | H |
| 5 | Ar1(A) | Ar2(A) | 1 | H | F |
| 6 | Ar1(A) | Ar2(A) | 2 | H | F |
| 7 | Ar1(A) | Ar2(B) | 1 | H | F |
| 8 | Ar1(A) | Ar2(B) | 2 | H | F |
| 9 | Ar1(A) | Ar2(A) | 1 | H | CH3 |
| 10 | Ar1(A) | Ar2(A) | 2 | H | CH3 |
| 11 | Ar1(A) | Ar2(B) | 1 | H | CH3 |
| 12 | Ar1(A) | Ar2(B) | 2 | H | CH3 |
| 13 | Ar1(A) | Ar2(A) | 1 | H | Ph |
| 14 | Ar1(A) | Ar2(A) | 2 | H | Ph |
| 15 | Ar1(A) | Ar2(B) | 1 | H | Ph |
| 16 | Ar1(A) | Ar2(B) | 2 | H | Ph |
| 17 | Ar1(A) | Ar2(A) | 1 | F | H |
| 18 | Ar1(A) | Ar2(A) | 2 | F | H |
| 19 | Ar1(A) | Ar2(B) | 1 | F | H |
| 20 | Ar1(A) | Ar2(B) | 2 | F | H |
| 21 | Ar1(A) | Ar2(A) | 1 | F | F |
| 22 | Ar1(A) | Ar2(A) | 2 | F | F |
| 23 | Ar1(A) | Ar2(B) | 1 | F | F |
| 24 | Ar1(A) | Ar2(B) | 2 | F | F |
| 25 | Ar1(A) | Ar2(A) | 1 | F | CH3 |
| 26 | Ar1(A) | Ar2(A) | 2 | F | CH3 |
| 27 | Ar1(A) | Ar2(B) | 1 | F | CH3 |
| 28 | Ar1(A) | Ar2(B) | 2 | F | CH3 |
| 29 | Ar1(A) | Ar2(A) | 1 | F | Ph |
| 30 | Ar1(A) | Ar2(A) | 2 | F | Ph |
| 31 | Ar1(A) | Ar2(B) | 1 | F | Ph |
| 32 | Ar1(A) | Ar2(B) | 2 | F | Ph |
| 33 | Ar1(A) | Ar2(A) | 1 | CH3 | H |
| 34 | Ar1(A) | Ar2(A) | 2 | CH3 | H |
| 35 | Ar1(A) | Ar2(B) | 1 | CH3 | H |
| 36 | Ar1(A) | Ar2(B) | 2 | CH3 | H |
| 37 | Ar1(A) | Ar2(A) | 1 | CH3 | F |
| 38 | Ar1(A) | Ar2(A) | 2 | CH3 | F |
| 39 | Ar1(A) | Ar2(B) | 1 | CH3 | F |
| 40 | Ar1(A) | Ar2(B) | 2 | CH3 | F |
| 41 | Ar1(A) | Ar2(A) | 1 | CH3 | CH3 |
| 42 | Ar1(A) | Ar2(A) | 2 | CH3 | CH3 |
| 43 | Ar1(A) | Ar2(B) | 1 | CH3 | CH3 |
| 44 | Ar1(A) | Ar2(B) | 2 | CH3 | CH3 |
| 45 | Ar1(A) | Ar2(A) | 1 | CH3 | Ph |
| 46 | Ar1(A) | Ar2(A) | 2 | CH3 | Ph |
| 47 | Ar1(A) | Ar2(B) | 1 | CH3 | Ph |
| 48 | Ar1(A) | Ar2(B) | 2 | CH3 | Ph |
| 49 | Ar1(A) | Ar2(A) | 1 | Ph | H |
| 50 | Ar1(A) | Ar2(A) | 2 | Ph | H |
| 51 | Ar1(A) | Ar2(B) | 1 | Ph | H |
| 52 | Ar1(A) | Ar2(B) | 2 | Ph | H |
| 53 | Ar1(A) | Ar2(A) | 1 | Ph | F |
| 54 | Ar1(A) | Ar2(A) | 2 | Ph | F |
| 55 | Ar1(A) | Ar2(B) | 1 | Ph | F |
| 56 | Ar1(A) | Ar2(B) | 2 | Ph | F |
| 57 | Ar1(A) | Ar2(A) | 1 | Ph | CH3 |
| 58 | Ar1(A) | Ar2(A) | 2 | Ph | CH3 |
| 59 | Ar1(A) | Ar2(B) | 1 | Ph | CH3 |
| 60 | Ar1(A) | Ar2(B) | 2 | Ph | CH3 |
| 61 | Ar1(A) | Ar2(A) | 1 | Ph | Ph |
| 62 | Ar1(A) | Ar2(A) | 2 | Ph | Ph |
| 63 | Ar1(A) | Ar2(B) | 1 | Ph | Ph |
| 64 | Ar1(A) | Ar2(B) | 2 | Ph | Ph |
| 65 | Ar1(B) | Ar2(A) | 1 | H | — |
| 66 | Ar1(B) | Ar2(A) | 2 | H | — |
| 67 | Ar1(B) | Ar2(B) | 1 | H | — |
| 68 | Ar1(B) | Ar2(B) | 2 | H | — |
| 69 | Ar1(B) | Ar2(A) | 1 | F | — |
| 70 | Ar1(B) | Ar2(A) | 2 | F | — |
| 71 | Ar1(B) | Ar2(B) | 1 | F | — |
| 72 | Ar1(B) | Ar2(B) | 2 | F | — |
| 73 | Ar1(B) | Ar2(A) | 1 | CH3 | — |
| 74 | Ar1(B) | Ar2(A) | 2 | CH3 | — |
| 75 | Ar1(B) | Ar2(B) | 1 | CH3 | — |
| 76 | Ar1(B) | Ar2(B) | 2 | CH3 | — |
| 77 | Ar1(B) | Ar2(A) | 1 | Ph | — |
| 78 | Ar1(B) | Ar2(A) | 2 | Ph | — |
| 79 | Ar1(B) | Ar2(B) | 1 | Ph | — |
| 80 | Ar1(B) | Ar2(B) | 2 | Ph | — |
| 81 | Ar1(C) | Ar2(A) | 1 | — | — |
| 82 | Ar1(C) | Ar2(A) | 2 | — | — |
| 83 | Ar1(C) | Ar2(B) | 1 | — | — |
| 84 | Ar1(C) | Ar2(B) | 2 | — | — |
| 85 | Ar1(D) | Ar2(A) | 1 | H | — |
| 86 | Ar1(D) | Ar2(A) | 2 | H | — |
| 87 | Ar1(D) | Ar2(B) | 1 | H | — |
| 88 | Ar1(D) | Ar2(B) | 2 | H | — |
| 89 | Ar1(D) | Ar2(A) | 1 | F | — |
| 90 | Ar1(D) | Ar2(A) | 2 | F | — |
| 91 | Ar1(D) | Ar2(B) | 1 | F | — |
| 92 | Ar1(D) | Ar2(B) | 2 | F | — |
| 93 | Ar1(D) | Ar2(A) | 1 | CH3 | — |
| 94 | Ar1(D) | Ar2(A) | 2 | CH3 | — |
| 95 | Ar1(D) | Ar2(B) | 1 | CH3 | — |
| 96 | Ar1(D) | Ar2(B) | 2 | CH3 | — |
| 97 | Ar1(D) | Ar2(A) | 1 | Ph | — |
| 98 | Ar1(D) | Ar2(A) | 2 | Ph | — |
| 99 | Ar1(D) | Ar2(B) | 1 | Ph | — |
| 100 | Ar1(D) | Ar2(B) | 2 | Ph | — |
| 101 | Ar1(E) | Ar2(A) | 1 | H | H |
| 102 | Ar1(E) | Ar2(A) | 2 | H | H |
| 103 | Ar1(E) | Ar2(B) | 1 | H | H |
| 104 | Ar1(E) | Ar2(B) | 2 | H | H |
| 105 | Ar1(E) | Ar2(A) | 1 | H | F |
| 106 | Ar1(E) | Ar2(A) | 2 | H | F |
| 107 | Ar1(E) | Ar2(B) | 1 | H | F |
| 108 | Ar1(E) | Ar2(B) | 2 | H | F |
| 109 | Ar1(E) | Ar2(A) | 1 | H | CH3 |
| 110 | Ar1(E) | Ar2(A) | 2 | H | CH3 |
| 111 | Ar1(E) | Ar2(B) | 1 | H | CH3 |
| 112 | Ar1(E) | Ar2(B) | 2 | H | CH3 |
| 113 | Ar1(E) | Ar2(A) | 1 | H | Ph |
| 114 | Ar1(E) | Ar2(A) | 2 | H | Ph |
| 115 | Ar1(E) | Ar2(B) | 1 | H | Ph |
| 116 | Ar1(E) | Ar2(B) | 2 | H | Ph |
| 117 | Ar1(E) | Ar2(A) | 1 | F | H |
| 118 | Ar1(E) | Ar2(A) | 2 | F | H |
| 119 | Ar1(E) | Ar2(B) | 1 | F | H |
| 120 | Ar1(E) | Ar2(B) | 2 | F | H |
| 121 | Ar1(E) | Ar2(A) | 1 | F | F |
| 122 | Ar1(E) | Ar2(A) | 2 | F | F |
| 123 | Ar1(E) | Ar2(B) | 1 | F | F |
| 124 | Ar1(E) | Ar2(B) | 2 | F | F |
| 125 | Ar1(E) | Ar2(A) | 1 | F | CH3 |
| 126 | Ar1(E) | Ar2(A) | 2 | F | CH3 |
| 127 | Ar1(E) | Ar2(B) | 1 | F | CH3 |
| 128 | Ar1(E) | Ar2(B) | 2 | F | CH3 |

TABLE 1-continued

| | | | | | |
|---|---|---|---|---|---|
| 129 | Ar1(E) | Ar2(A) | 1 | F | Ph |
| 130 | Ar1(E) | Ar2(A) | 2 | F | Ph |
| 131 | Ar1(E) | Ar2(B) | 1 | F | Ph |
| 132 | Ar1(E) | Ar2(B) | 2 | F | Ph |
| 133 | Ar1(E) | Ar2(A) | 1 | CH3 | H |
| 134 | Ar1(E) | Ar2(A) | 2 | CH3 | H |
| 135 | Ar1(E) | Ar2(B) | 1 | CH3 | H |
| 136 | Ar1(E) | Ar2(B) | 2 | CH3 | H |
| 137 | Ar1(E) | Ar2(A) | 1 | CH3 | F |
| 138 | Ar1(E) | Ar2(A) | 2 | CH3 | F |
| 139 | Ar1(E) | Ar2(B) | 1 | CH3 | F |
| 140 | Ar1(E) | Ar2(B) | 2 | CH3 | F |
| 141 | Ar1(E) | Ar2(A) | 1 | CH3 | CH3 |
| 142 | Ar1(E) | Ar2(A) | 2 | CH3 | CH3 |
| 143 | Ar1(E) | Ar2(B) | 1 | CH3 | CH3 |
| 144 | Ar1(E) | Ar2(B) | 2 | CH3 | CH3 |
| 145 | Ar1(E) | Ar2(A) | 1 | CH3 | Ph |
| 146 | Ar1(E) | Ar2(A) | 2 | CH3 | Ph |
| 147 | Ar1(E) | Ar2(B) | 1 | CH3 | Ph |
| 148 | Ar1(E) | Ar2(B) | 2 | CH3 | Ph |
| 149 | Ar1(E) | Ar2(A) | 1 | Ph | H |
| 150 | Ar1(E) | Ar2(A) | 2 | Ph | H |
| 151 | Ar1(E) | Ar2(B) | 1 | Ph | H |
| 152 | Ar1(E) | Ar2(B) | 2 | Ph | H |
| 153 | Ar1(E) | Ar2(A) | 1 | Ph | F |
| 154 | Ar1(E) | Ar2(A) | 2 | Ph | F |
| 155 | Ar1(E) | Ar2(B) | 1 | Ph | F |
| 156 | Ar1(E) | Ar2(B) | 2 | Ph | F |
| 157 | Ar1(E) | Ar2(A) | 1 | Ph | CH3 |
| 158 | Ar1(E) | Ar2(A) | 2 | Ph | CH3 |
| 159 | Ar1(E) | Ar2(B) | 1 | Ph | CH3 |
| 160 | Ar1(E) | Ar2(B) | 2 | Ph | CH3 |
| 161 | Ar1(E) | Ar2(A) | 1 | Ph | Ph |
| 162 | Ar1(E) | Ar2(A) | 2 | Ph | Ph |
| 163 | Ar1(E) | Ar2(B) | 1 | Ph | Ph |
| 164 | Ar1(E) | Ar2(B) | 2 | Ph | Ph |
| 165 | Ar1(F) | Ar2(A) | 1 | H | — |
| 166 | Ar1(F) | Ar2(A) | 2 | H | — |
| 167 | Ar1(F) | Ar2(B) | 1 | H | — |
| 168 | Ar1(F) | Ar2(B) | 2 | H | — |
| 169 | Ar1(F) | Ar2(A) | 1 | F | — |
| 170 | Ar1(F) | Ar2(A) | 2 | F | — |
| 171 | Ar1(F) | Ar2(B) | 1 | F | — |
| 172 | Ar1(F) | Ar2(B) | 2 | F | — |
| 173 | Ar1(F) | Ar2(A) | 1 | CH3 | — |
| 174 | Ar1(F) | Ar2(A) | 2 | CH3 | — |
| 175 | Ar1(F) | Ar2(B) | 1 | CH3 | — |
| 176 | Ar1(F) | Ar2(B) | 2 | CH3 | — |
| 177 | Ar1(F) | Ar2(A) | 1 | Ph | — |
| 178 | Ar1(F) | Ar2(A) | 2 | Ph | — |
| 179 | Ar1(F) | Ar2(B) | 1 | Ph | — |
| 180 | Ar1(F) | Ar2(B) | 2 | Ph | — |
| 181 | Ar1(F) | Ar2(A) | 1 | — | — |
| 182 | Ar1(F) | Ar2(A) | 2 | — | — |
| 183 | Ar1(F) | Ar2(B) | 1 | — | — |
| 184 | Ar1(F) | Ar2(B) | 2 | — | — |
| 185 | Ar1(F) | Ar2(A) | 1 | H | — |
| 186 | Ar1(H) | Ar2(A) | 2 | H | — |
| 187 | Ar1(H) | Ar2(B) | 1 | H | — |
| 188 | Ar1(H) | Ar2(B) | 2 | H | — |
| 189 | Ar1(H) | Ar2(A) | 1 | F | — |
| 190 | Ar1(H) | Ar2(A) | 2 | F | — |
| 191 | Ar1(H) | Ar2(B) | 1 | F | — |
| 192 | Ar1(H) | Ar2(B) | 2 | F | — |
| 193 | Ar1(H) | Ar2(A) | 1 | CH3 | — |
| 194 | Ar1(H) | Ar2(A) | 2 | CH3 | — |
| 195 | Ar1(H) | Ar2(B) | 1 | CH3 | — |
| 196 | Ar1(H) | Ar2(B) | 2 | CH3 | — |
| 197 | Ar1(H) | Ar2(A) | 1 | Ph | — |
| 198 | Ar1(H) | Ar2(A) | 2 | Ph | — |
| 199 | Ar1(H) | Ar2(B) | 1 | Ph | — |
| 200 | Ar1(H) | Ar2(B) | 2 | Ph | — |
| 201 | Ar1(I) | Ar2(A) | 1 | — | — |
| 202 | Ar1(I) | Ar2(A) | 2 | — | — |
| 203 | Ar1(I) | Ar2(B) | 1 | — | — |
| 204 | Ar1(I) | Ar2(B) | 2 | — | — |

Examples of preferred compounds of the formula (4) are the compounds listed in Table 2 below. Ph stands for a phenyl group. The abbreviations entered in the table stand for the following groups, where the dashed line in each case indicates the link to the anthracene:

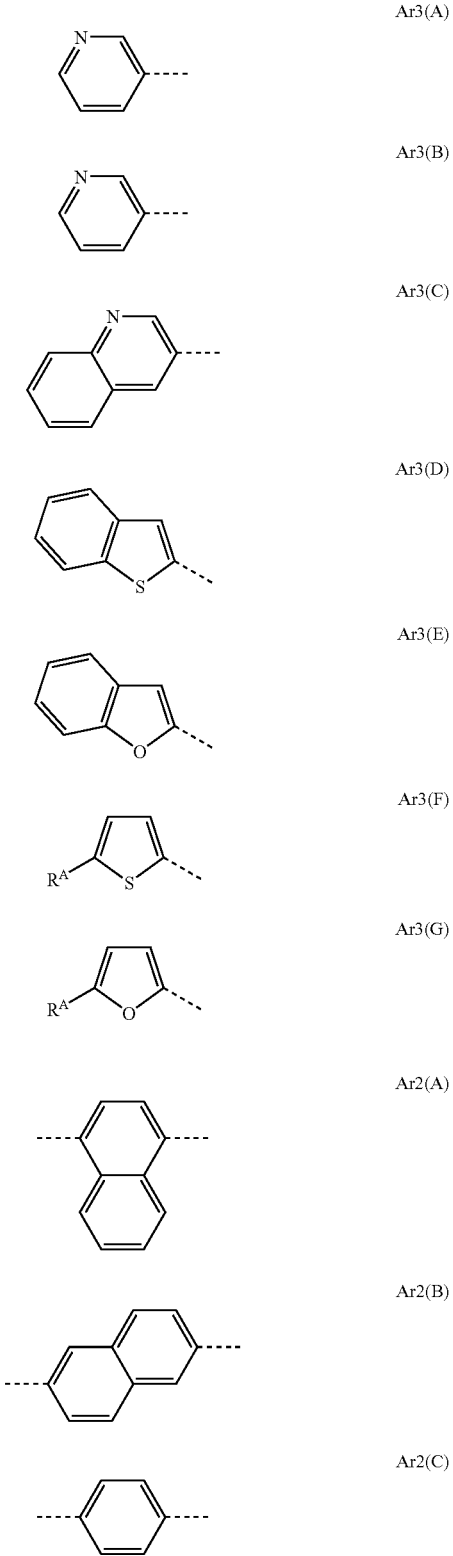

TABLE 2

TABLE 2-continued

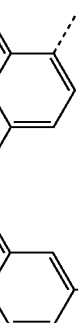

Ar2(D)

Ar2(E)

Ar2(F)

| No. | Ar³ | Ar² | m | Ar3 R1 |
|---|---|---|---|---|
| 1 | Ar3(A) | Ar2(A) | 1 | — |
| 2 | Ar3(A) | Ar2(A) | 2 | — |
| 3 | Ar3(A) | Ar2(B) | 1 | — |
| 4 | Ar3(A) | Ar2(B) | 2 | — |
| 5 | Ar3(A) | Ar2(C) | 1 | — |
| 6 | Ar3(A) | Ar2(C) | 2 | — |
| 7 | Ar3(A) | Ar2(D) | 1 | — |
| 8 | Ar3(A) | Ar2(D) | 2 | — |
| 9 | Ar3(A) | Ar2(E) | 1 | — |
| 10 | Ar3(A) | Ar2(E) | 2 | — |
| 11 | Ar3(A) | Ar2(F) | 1 | — |
| 12 | Ar3(A) | Ar2(F) | 2 | — |
| 13 | Ar3(B) | Ar2(A) | 1 | — |
| 14 | Ar3(B) | Ar2(A) | 2 | — |
| 15 | Ar3(B) | Ar2(B) | 1 | — |
| 16 | Ar3(B) | Ar2(B) | 2 | — |
| 17 | Ar3(B) | Ar2(C) | 1 | — |
| 18 | Ar3(B) | Ar2(C) | 2 | — |
| 19 | Ar3(B) | Ar2(D) | 1 | — |
| 20 | Ar3(B) | Ar2(D) | 2 | — |
| 21 | Ar3(B) | Ar2(E) | 1 | — |
| 22 | Ar3(B) | Ar2(E) | 2 | — |
| 23 | Ar3(B) | Ar2(F) | 1 | — |
| 24 | Ar3(B) | Ar2(F) | 2 | — |
| 25 | Ar3(C) | Ar2(A) | 1 | — |
| 26 | Ar3(C) | Ar2(A) | 2 | — |
| 27 | Ar3(C) | Ar2(B) | 1 | — |
| 28 | Ar3(C) | Ar2(B) | 2 | — |
| 29 | Ar3(C) | Ar2(C) | 1 | — |
| 30 | Ar3(C) | Ar2(C) | 2 | — |
| 31 | Ar3(C) | Ar2(D) | 1 | — |
| 32 | Ar3(C) | Ar2(D) | 2 | — |
| 33 | Ar3(C) | Ar2(E) | 1 | — |
| 34 | Ar3(C) | Ar2(E) | 2 | — |
| 35 | Ar3(C) | Ar2(F) | 1 | — |
| 36 | Ar3(C) | Ar2(F) | 2 | — |
| 37 | Ar3(D) | Ar2(A) | 1 | — |
| 38 | Ar3(D) | Ar2(A) | 2 | — |
| 39 | Ar3(D) | Ar2(B) | 1 | — |
| 40 | Ar3(D) | Ar2(B) | 2 | — |
| 41 | Ar3(D) | Ar2(C) | 1 | — |
| 42 | Ar3(D) | Ar2(C) | 2 | — |
| 43 | Ar3(D) | Ar2(D) | 1 | — |
| 44 | Ar3(D) | Ar2(D) | 2 | — |
| 45 | Ar3(D) | Ar2(E) | 1 | — |
| 46 | Ar3(D) | Ar2(E) | 2 | — |
| 47 | Ar3(D) | Ar2(F) | 1 | — |
| 48 | Ar3(D) | Ar2(F) | 2 | — |
| 49 | Ar3(E) | Ar2(A) | 1 | — |
| 50 | Ar3(E) | Ar2(A) | 2 | — |
| 51 | Ar3(E) | Ar2(B) | 1 | — |
| 52 | Ar3(E) | Ar2(B) | 2 | — |
| 53 | Ar3(E) | Ar2(C) | 1 | — |
| 54 | Ar3(E) | Ar2(C) | 2 | — |
| 55 | Ar3(E) | Ar2(D) | 1 | — |
| 56 | Ar3(E) | Ar2(D) | 2 | — |
| 57 | Ar3(E) | Ar2(E) | 1 | — |
| 58 | Ar3(E) | Ar2(E) | 2 | — |
| 59 | Ar3(E) | Ar2(F) | 1 | — |
| 60 | Ar3(E) | Ar2(F) | 2 | — |
| 61 | Ar3(F) | Ar2(A) | 1 | H |
| 62 | Ar3(F) | Ar2(A) | 2 | H |
| 63 | Ar3(F) | Ar2(B) | 1 | H |
| 64 | Ar3(F) | Ar2(B) | 2 | H |
| 65 | Ar3(F) | Ar2(C) | 1 | H |
| 66 | Ar3(F) | Ar2(C) | 2 | H |
| 67 | Ar3(F) | Ar2(D) | 1 | H |
| 68 | Ar3(F) | Ar2(D) | 2 | H |
| 69 | Ar3(F) | Ar2(E) | 1 | H |
| 70 | Ar3(F) | Ar2(E) | 2 | H |
| 71 | Ar3(F) | Ar2(F) | 1 | H |
| 72 | Ar3(F) | Ar2(F) | 2 | H |
| 73 | Ar3(F) | Ar2(A) | 1 | F |
| 74 | Ar3(F) | Ar2(A) | 2 | F |
| 75 | Ar3(F) | Ar2(B) | 1 | F |
| 76 | Ar3(F) | Ar2(B) | 2 | F |
| 77 | Ar3(F) | Ar2(C) | 1 | F |
| 78 | Ar3(F) | Ar2(C) | 2 | F |
| 79 | Ar3(F) | Ar2(D) | 1 | F |
| 80 | Ar3(F) | Ar2(D) | 2 | F |
| 81 | Ar3(F) | Ar2(E) | 1 | F |
| 82 | Ar3(F) | Ar2(E) | 2 | F |
| 83 | Ar3(F) | Ar2(F) | 1 | F |
| 84 | Ar3(F) | Ar2(F) | 2 | F |
| 85 | Ar3(F) | Ar2(A) | 1 | CH3 |
| 86 | Ar3(F) | Ar2(A) | 2 | CH3 |
| 87 | Ar3(F) | Ar2(B) | 1 | CH3 |
| 88 | Ar3(F) | Ar2(B) | 2 | CH3 |
| 89 | Ar3(F) | Ar2(C) | 1 | CH3 |
| 90 | Ar3(F) | Ar2(C) | 2 | CH3 |
| 91 | Ar3(F) | Ar2(D) | 1 | CH3 |
| 92 | Ar3(F) | Ar2(D) | 2 | CH3 |
| 93 | Ar3(F) | Ar2(E) | 1 | CH3 |
| 94 | Ar3(F) | Ar2(E) | 2 | CH3 |
| 95 | Ar3(F) | Ar2(F) | 1 | CH3 |
| 96 | Ar3(F) | Ar2(F) | 2 | CH3 |
| 97 | Ar3(F) | Ar2(A) | 1 | Ph |
| 98 | Ar3(F) | Ar2(A) | 2 | Ph |
| 99 | Ar3(F) | Ar2(B) | 1 | Ph |
| 100 | Ar3(F) | Ar2(B) | 2 | Ph |
| 101 | Ar3(F) | Ar2(C) | 1 | Ph |
| 102 | Ar3(F) | Ar2(C) | 2 | Ph |
| 103 | Ar3(F) | Ar2(D) | 1 | Ph |
| 104 | Ar3(F) | Ar2(D) | 2 | Ph |
| 105 | Ar3(F) | Ar2(E) | 1 | Ph |
| 106 | Ar3(F) | Ar2(E) | 2 | Ph |
| 107 | Ar3(F) | Ar2(F) | 1 | Ph |
| 108 | Ar3(F) | Ar2(F) | 2 | Ph |
| 109 | Ar3(G) | Ar2(A) | 1 | H |
| 110 | Ar3(G) | Ar2(A) | 2 | H |
| 111 | Ar3(G) | Ar2(B) | 1 | H |
| 112 | Ar3(G) | Ar2(B) | 2 | H |
| 113 | Ar3(G) | Ar2(C) | 1 | H |
| 114 | Ar3(G) | Ar2(C) | 2 | H |
| 115 | Ar3(G) | Ar2(D) | 1 | H |
| 116 | Ar3(G) | Ar2(D) | 2 | H |
| 117 | Ar3(G) | Ar2(E) | 1 | H |
| 118 | Ar3(G) | Ar2(E) | 2 | H |
| 119 | Ar3(G) | Ar2(F) | 1 | H |
| 120 | Ar3(G) | Ar2(F) | 2 | H |
| 121 | Ar3(G) | Ar2(A) | 1 | F |
| 122 | Ar3(G) | Ar2(A) | 2 | F |
| 123 | Ar3(G) | Ar2(B) | 1 | F |
| 124 | Ar3(G) | Ar2(B) | 2 | F |
| 125 | Ar3(G) | Ar2(C) | 1 | F |
| 126 | Ar3(G) | Ar2(C) | 2 | F |

TABLE 2-continued

| | | | | |
|---|---|---|---|---|
| 127 | Ar3(G) | Ar2(D) | 1 | F |
| 128 | Ar3(G) | Ar2(D) | 2 | F |
| 129 | Ar3(G) | Ar2(E) | 1 | F |
| 130 | Ar3(G) | Ar2(E) | 2 | F |
| 131 | Ar3(G) | Ar2(F) | 1 | F |
| 132 | Ar3(G) | Ar2(F) | 2 | F |
| 133 | Ar3(G) | Ar2(A) | 1 | CH3 |
| 134 | Ar3(G) | Ar2(A) | 2 | CH3 |
| 135 | Ar3(G) | Ar2(B) | 1 | CH3 |
| 136 | Ar3(G) | Ar2(B) | 2 | CH3 |
| 137 | Ar3(G) | Ar2(C) | 1 | CH3 |
| 138 | Ar3(G) | Ar2(C) | 2 | CH3 |
| 139 | Ar3(G) | Ar2(D) | 1 | CH3 |
| 140 | Ar3(G) | Ar2(D) | 2 | CH3 |
| 141 | Ar3(G) | Ar2(E) | 1 | CH3 |
| 142 | Ar3(G) | Ar2(E) | 2 | CH3 |
| 143 | Ar3(G) | Ar2(F) | 1 | CH3 |
| 144 | Ar3(G) | Ar2(F) | 2 | CH3 |
| 145 | Ar3(G) | Ar2(A) | 1 | Ph |
| 146 | Ar3(G) | Ar2(A) | 2 | Ph |
| 147 | Ar3(G) | Ar2(B) | 1 | Ph |
| 148 | Ar3(G) | Ar2(B) | 2 | Ph |
| 149 | Ar3(G) | Ar2(C) | 1 | Ph |
| 150 | Ar3(G) | Ar2(C) | 2 | Ph |
| 151 | Ar3(G) | Ar2(D) | 1 | Ph |
| 152 | Ar3(G) | Ar2(D) | 2 | Ph |
| 153 | Ar3(G) | Ar2(E) | 1 | Ph |
| 154 | Ar3(G) | Ar2(E) | 2 | Ph |
| 155 | Ar3(G) | Ar2(F) | 1 | Ph |
| 156 | Ar3(G) | Ar2(F) | 2 | Ph |

The compounds according to the invention can be synthesised by a sequence of transition metal-catalysed coupling reactions. A coupling reaction which has proven particularly successful is the Suzuki coupling of arylboronic acid derivatives, for example arylboronic acids or arylboronic acid esters, and aromatic halides, in particular with palladium catalysis. The typical reaction conditions for the Suzuki coupling are known to the person skilled in the art. It is likewise known to the person skilled in the art that suitable halides are, in particular, the bromides and iodides, but that other leaving groups, such as, for example, tosylate, triflate or sulfonates in general, can also be used. Thus, for example, it is possible to synthesise a diboronic acid derivative of the central aromatic unit $Ar^2$, which is coupled to an optionally substituted 9-haloanthracene in a Suzuki coupling. In a further step, the anthracene can be halogenated, for example brominated using NBS, in the 10-position. The halogenated compound can be coupled in a further step to a boronic acid derivative of the group $Ar^1$ in a Suzuki coupling to give the compound of the formula (1), or of the formula (3) or formula (4). Conversely, it is likewise possible firstly to couple a boronic acid derivative of the group $Ar^1$ to an optionally substituted 9-haloanthracene in a Suzuki coupling, which can be halogenated in a further step in the 10-position, for example using NBS. The halogenated compound can be coupled in a further step to a diboronic acid derivative of the group $Ar^2$ in a Suzuki coupling to give the compound of the formula (1), or of the formula (3) or formula (4), or, after conversion into a boronic acid derivative, can be coupled to a dihalide of the group $Ar^2$. These processes are independent of the precise structure of the groups $Ar^1$ and $Ar^2$ and are used equally for aromatic and heteroaromatic groups $Ar^1$, $Ar^2$ and $Ar^3$. Instead of the Suzuki coupling, other metal-catalysed coupling reactions are also suitable, such as, for example, the Stille coupling, i.e. the coupling of organotin compounds with palladium catalysis.

The invention furthermore relates to a process for the synthesis of compounds of the formula (1), or of the formula (3) or formula (4), characterised in that the bonds between the anthracene and the groups $Ar^1$ or $Ar^2$ or $Ar^3$ are formed by Suzuki coupling.

The compound of the following formula (11) is a valuable intermediate for the synthesis of compounds of the formula (1), or of the formula (3) or formula (4), by the process described above.

The invention therefore furthermore relates to a compound of the formula (11)

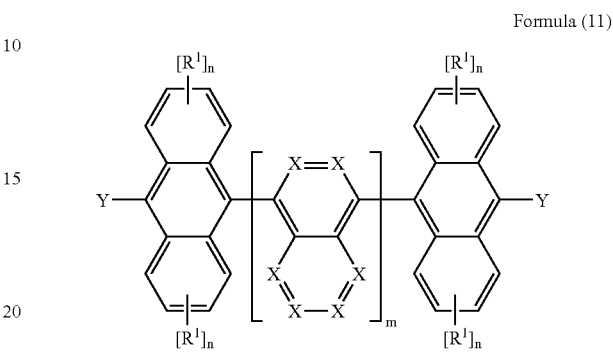

Formula (11)

where Y, identically or differently on each occurrence, stands for chlorine, bromine, iodine or a group of the formula $OSO_2R^3$, where R represents an organic group having 1 to 20 C atoms, in which, in addition, individual H atoms may be replaced by fluorine, in particular for bromine, and the other symbols and indices have the meaning given above.

The compounds of the formula (1), or of the formula (3) or formula (4), are suitable for use in organic electronic devices, in particular in organic electroluminescent devices.

The invention therefore furthermore relates to the use of the compounds of the formula (1), or of the formula (3) or formula (4), in organic electronic devices, in particular in organic electroluminescent devices.

The invention again furthermore relates to organic electronic devices containing at least one compound of the formula (1), or of the formula (3) or formula (4). The organic electronic devices are preferably selected from organic electroluminescent devices (OLEDs, PLEDs), organic field-effect transistors (O-FETs), organic thin-film transistors (O-TFTs), organic light-emitting transistors (O-LETs), organic integrated circuits (O-ICs), organic solar cells (O-SCs), organic field-quench devices (O-FQDs), organic photo receptors or organic laser diodes (O-lasers); particular preference is given to organic electroluminescent devices (OLEDs, PLEDs).

The organic electroluminescent device comprises anode, cathode and at least one emitting layer and may also comprise further layers. These may be, for example: hole-injection layer, hole-transport layer, electron-transport layer, electron-injection layer and/or a charge-generation layer (T. Matsumoto et al., *Multiphoton Organic EL Device Having Charge Generation Layer*, IDMC 2003, Taiwan; Session 21 OLED (5)). The materials in these layers may also be doped. However, each of these layers does not necessarily have to be present. Suitable hole-transport materials are, for example, aromatic amines, as usually used in accordance with the prior art, which may also be p-doped. Suitable electron-transport materials are, for example, metal chelate complexes, for example $AlQ_3$, compounds based on electron-deficient heterocycles, for example triazine derivatives, compounds containing aromatic carbonyls or phosphine oxides, as described, for example, in WO 05/084081 and WO 05/084082, or also further electron-transport materials in accordance with the prior art, which may each also be n-doped. Suitable electron-injection materials are, in particular, fluorides and oxides of the alkali and alkaline-earth metals, for example NaF, $BaF_2$, $CaF_2$, LiF or $Li_2O$.

The compound of the formula (1), or of the formula (3) or formula (4), is preferably employed in an emitting layer. It is preferably employed here as host material together with a dopant. A host material is taken to mean the component in a system comprising host and dopant (binary mixture) which is present in the higher proportion in the system. In a system comprising a host and a plurality of dopants (ternary and higher mixtures), the host is taken to mean the component whose proportion in the mixture is the highest. The compound of the formula (1), or of the formula (3) or (4), is particularly suitable here as host material for blue singlet emitters, but also for green- or red-emitting compounds.

The proportion of the compound of the formula (1), or of the formula (3) or formula (4), in the mixture is between 50.0 and 99.9% by weight, preferably between 80.0 and 99.5% by weight, particularly preferably between 90.0 and 99.0% by weight. The proportion of the dopant(s) in the mixture is correspondingly between 0.1 and 50.0% by weight, preferably between 0.5 and 20.0% by weight, particularly preferably between 1.0 and 10.0% by weight.

Preferred dopants are selected from the class of the monostyrylamines, the distyrylamines, the tristyrylamines, the tetrastyrylamines, the styrylphosphines, the styryl ethers and the arylamines. A monostyrylamine is taken to mean a compound which contains one substituted or unsubstituted styryl group and at least one, preferably aromatic amine. A distyrylamine is taken to mean a compound which contains two substituted or unsubstituted styryl groups and at least one, preferably aromatic amine. A tristyrylamine is taken to mean a compound which contains three substituted or unsubstituted styryl groups and at least one, preferably aromatic amine. A tetrastyrylamine is taken to mean a compound which contains four substituted or unsubstituted styryl groups and at least one, preferably aromatic amine. The styryl groups are particularly preferably stilbenes, which may also be further substituted. Corresponding phosphines and ethers are defined analogously to the amines. For the purposes of this invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyrenamines, pyrenediamines, chrysenamines and chrysenediamines are defined analogously thereto, where the diarylamino groups are preferably bonded to the pyrene in the 1-position or in the 1,6-position. Particularly preferred dopants are selected from the classes of the tristilbenamines, the aromatic stilbenediamines, the anthracenediamines, the pyrenediamines and the chrysenediamines. Examples of dopants of this type are substituted or unsubstituted tristilbenamines or the dopants described in WO 06/000388, WO 06/058737 and WO 06/000389.

Preference is furthermore given to organic electroluminescent devices, characterised in that a plurality of emitting layers are used, where at least one of these layers comprises at least one compound of the formula (1), or of the formula (3) or formula (4). These emission layers particularly preferably have in total a plurality of emission maxima between 380 nm and 750 nm, resulting overall in white emission, i.e. at least one further emitting compound which is able to fluoresce or phosphoresce is used in the further emitting layer(s). Particular preference is given to three-layer systems, where the three layers exhibit blue, green and orange or red emission (for the basic structure see, for example, WO 05/011013).

Apart from the compound of the formula (1), or of the formula (3) or formula (4), and the dopant(s), further substances, for example hole- or electron-transport materials, may also be present in the emitting layer.

In a further embodiment of the invention, the compounds of the formula (1), or of the formula (3) or (4), are employed as emitting materials, in particular as blue- or green-emitting materials. The proportion of the compound of the formula (1), or of the formula (3) or (4), in the mixture of the emitting layer is then between 0.1 and 50.0% by weight, preferably between 0.5 and 20.0% by weight, particularly preferably between 1.0 and 10.0% by weight. Correspondingly, the proportion of the host material is between 50.0 and 99.9% by weight, preferably between 80.0 and 99.5% by weight, particularly preferably between 90.0 and 99.0% by weight. Suitable host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268) or the boronic acid derivatives (for example in accordance with WO 06/117052). Suitable host materials are furthermore also the compounds according to the invention described above Apart from the compounds according to the invention, particularly preferred host materials are selected from the classes of the oligoarylenes containing naphthalene, anthracene and/or pyrene or atropisomers of these compounds, the oligoarylenevinylenes, the ketones, the phosphine oxides and the sulfoxides. Apart from the compounds according to the invention, very particularly preferred host materials are selected from the classes of the oligoarylenes containing anthracene and/or pyrene or atropisomers of these compounds, the phosphine oxides and the sulfoxides. For the purposes of this invention, an oligoarylene is intended to be taken to mean a compound in which at least three aryl or arylene groups are bonded to one another.

In still another embodiment of the invention, the compounds of the formula (1), or of the formula (3) or (4), are employed as electron-transport material. It is preferred here for one or more groups $Ar^1$ or $Ar^2$ or $Ar^3$ to contain at least one electron-deficient heterocyclic compound, for example nitrogen heterocycles, such as pyridine, pyrimidine, quinoline, etc. It may furthermore be preferred for the compound to be doped with electron-donor compounds.

The organic electroluminescent device can be produced by application of one or more layers by a sublimation process, where the materials are vapour-deposited in vacuum sublimation units at a pressure below $10^{-5}$ mbar, preferably below $10^{-6}$ mbar, particularly preferably below $10^{-7}$ mbar.

The production can furthermore be carried out by application of one or more layers by means of the OVPD (organic vapour phase deposition) process or with the aid of carrier-gas sublimation, where the materials are applied at a pressure between $10^{-5}$ mbar and 1 bar.

The production can furthermore be carried out by application of one or more layers from solution, such as, for example, by spin coating, or by means of any desired printing process, such as, for example, screen printing, flexographic printing or offset printing, but preferably LITI (light induced thermal imaging, thermal transfer printing) or ink-jet printing. Soluble compounds of the formula (1), or of the formula (3) or formula (4), are necessary for this purpose. High solubility can be achieved either through suitable substitution of the compounds or also through the choice of suitable atropisomers.

The invention therefore furthermore relates to a process for the production of organic electroluminescent devices, characterised in that at least one compound of the formula (1), or of the formula (3) or formula (4), optionally together with a dopant and/or other compounds, is applied by a sublimation process or from solution, for example by a printing process.

The organic electroluminescent devices according to the invention have the following surprising advantages over the prior art:
1. The stability of the devices becomes higher compared with systems in accordance with the prior art, which is evident, in particular, from a significantly longer lifetime.
2. The organic electroluminescent devices have significantly higher efficiency, in particular in the case of blue luminescence, compared with systems in accordance with the prior art.
3. The compounds according to the invention have a high glass-transition temperature and a low crystallisation tendency and are therefore particularly suitable for use in organic electroluminescent devices.

The present application text and also the examples following below are directed to the use of mixtures according to the invention in relation to OLEDs and the corresponding displays. In spite of this restriction of the description, it is possible for the person skilled in the art, without inventive step, also to use the compounds according to the invention for the further electronic devices mentioned above.

The invention is explained in greater detail by the following examples without wishing it to be restricted thereby.

EXAMPLES

The following syntheses are carried out under a protective-gas atmosphere, unless indicated otherwise. The starting materials can be purchased from ALDRICH or ABCR or prepared by syntheses known from the literature.

Example 1

Preparation of 1,4-bis[9-(2-naphthyl)]-10-anthrylnaphthalene a) Naphthalene-1,4-diboronic acid ethylene glycol ester

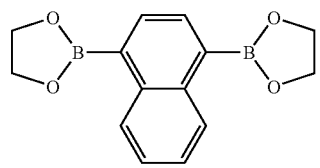 [SMILES: c1ccc2c(B3OCCO3)ccc(B3OCCO3)c2c1]

A Grignard solution, prepared from 223.5 g (780 mmol) of dibromonaphthalene and 41.5 g (1.6 mol) of magnesium in 1500 ml of dried THF, is added dropwise at −75° C. to 260 ml (2.34 mol) of trimethyl borate in 500 ml of THF, the mixture is stirred at −50° C. for 1 h, then warmed to RT, hydrolysed using 500 ml of water and 50 ml of conc. acetic acid and worked up by extraction. The residue obtained after removal of the solvent is boiled with 110 ml (1.6 mol) of ethylene glycol in 1000 ml of toluene on a water separator, the solvent is removed, and the residue is recrystallised from ethyl acetate/heptane, leaving 157.1 g (75%) of the diester as a pale-yellow, crystalline solid.

b) Preparation of 1,4-bis(9-anthryl)naphthalene

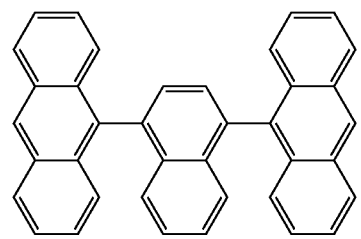 [SMILES: c1ccc2c(-c3ccc(-c4c5ccccc5cc5ccccc45)c4ccccc34)c3ccccc3cc2c1]

22.8 g (90 mmol) of 9-bromoanthracene and 11.9 g (45 mmol) of naphthalene-1,4-diboronic acid ethylene glycol ester are initially introduced in 550 ml of dimethoxyethane and 140 ml of ethanol, 440 ml of 2 M Na$_2$CO$_3$ solution are added, and the mixture is saturated with nitrogen. 3.2 g (10.7 mmol) of tris-ortho-tolylphosphine and 400 mg (1.8 mmol) of palladium(II) acetate are subsequently added, and the mixture is heated at the boil for 48 h. When the reaction is complete, 400 ml of water are added, the solid is filtered off with suction, washed repeatedly with water and EtOH and dried in vacuo. Filtration and recrystallisation from 1,4-dioxane gives a colourless solid (18.4 g, 87%).

c) Preparation of 1,4-bis[(10-(9-bromoanthryl)]naphthalene

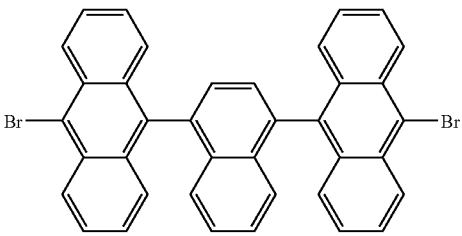 [SMILES: Brc1c2ccccc2c(-c2ccc(-c3c4ccccc4c(Br)c4ccccc34)c3ccccc23)c2ccccc12]

9.1 g (18.9 mmol) of 1,4-bis(9-anthryl)naphthalene are suspended in 150 ml of dichloromethane, 7.1 g of NBS are added, and the resultant suspension is stirred at RT for 24 h. The reaction mixture is evaporated in a rotary evaporator, washed by boiling in EtOH/H$_2$O (1:1) and subsequently recrystallised from dioxane, giving 11.2 g (93%) of a pale-yellow solid having a purity of >98% (RP-HPLC).

d) Preparation of 1,4-bis[9-(2-naphthyl)-10-anthryl]naphthalene

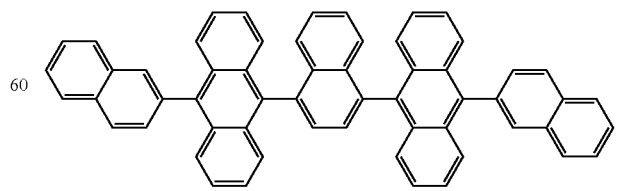

30.0 g (44.4 mmol) of 1,4-bis[(10-(9-bromoanthryl)]naphthalene, 19.1 g (110.9 mmol) of naphthalene-2-boronic acid, 4.4 g (3.84 mmol) of palladium tetrakistriphenylphosphine and 440 ml of 2 M Na$_2$CO$_3$ solution are suspended in 550 ml of dimethoxyethane and 140 ml of ethanol and heated at the boil for 48 h. The solid is filtered off, washed with water and ethanol, dissolved in chloroform and filtered. Subsequent recrystallisation from toluene and sublimation gives a pale-yellow solid which has a purity of >99.9% (determined by RP-HPLC). Yield: 20 g (68%). T$_G$=195° C.

Examples 2-14

The following compounds are prepared analogously to Example 1 in the stated yields with a purity of 99.9% according to RP-HPLC starting from the boronic acids mentioned by coupling to the dibromide prepared in 1c) by the process described in 1d).

| Ex. | Boronic acid coupling analogously to 1c) | Product | Yield |
|---|---|---|---|
| 2 | 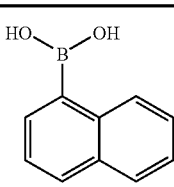 | 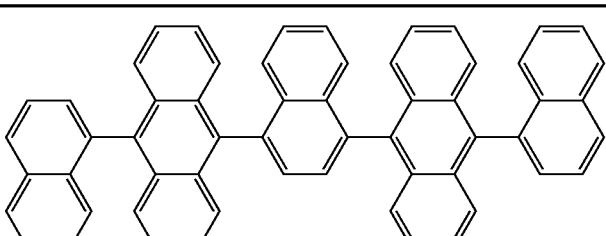 | 81%* |
| 3 | 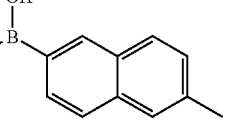 | 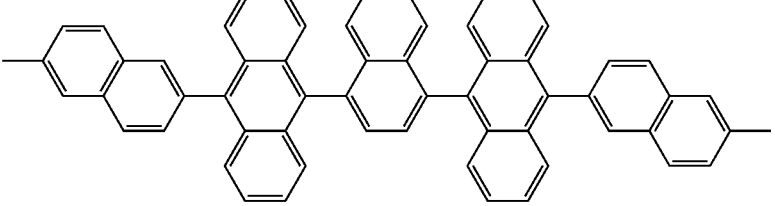 | 73% |
| 4 | 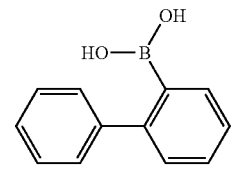 [SMILES: OB(O)c1ccccc1-c1ccccc1] | 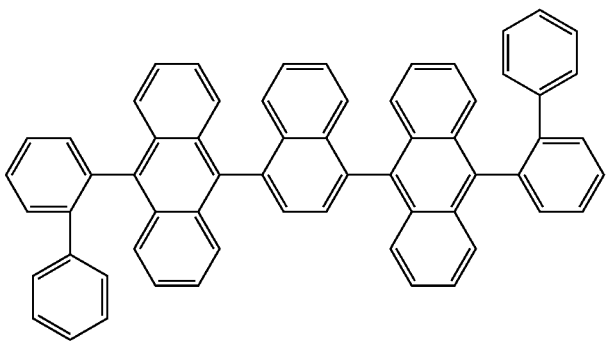 [SMILES: c1ccc(-c2ccccc2-c2c3ccccc3c(-c3ccc(-c4c5ccccc5c(-c5ccccc5-c5ccccc5)c5ccccc45)c4ccccc34)c3ccccc23)cc1] | 55%* |
| 5 | 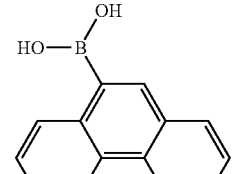 | 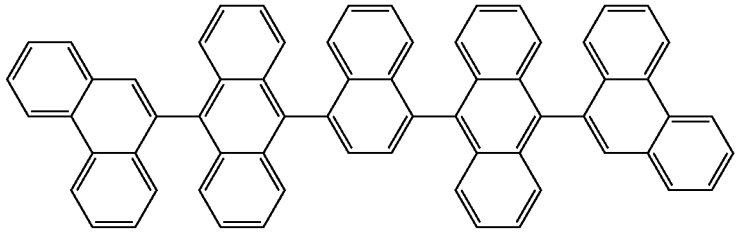 [SMILES: c1ccc2c(c1)cc(-c1c3ccccc3c(-c3ccc(-c4c5ccccc5c(-c5cc6ccccc6c6ccccc56)c5ccccc45)c4ccccc34)c3ccccc13)c1ccccc12] | 81%* |
| 6 | 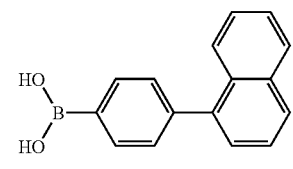 [SMILES: OB(O)c1ccc(-c2cccc3ccccc23)cc1] | 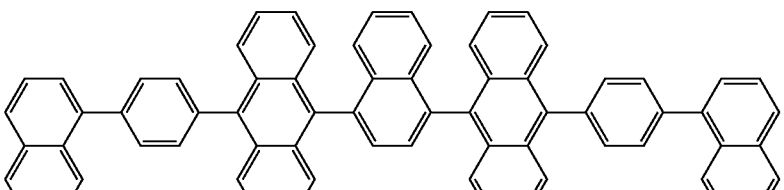 | 66% |

-continued
| Ex. | Boronic acid coupling analogously to 1c) | Product | Yield |
|---|---|---|---|
| 7 | 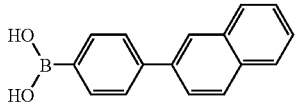 | 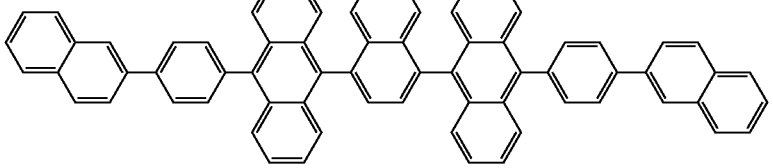 | 60% |
| 8 | 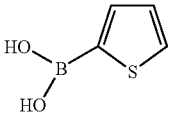 | 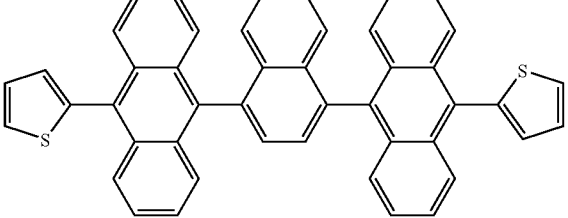 | 79% |
| 9 | 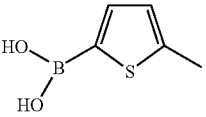 | 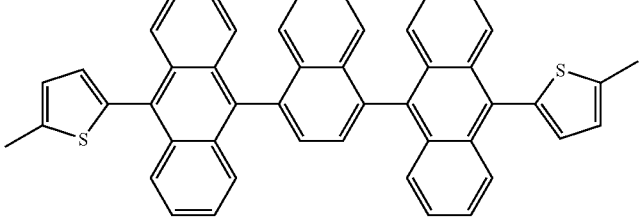 | 65% |
| 10 | 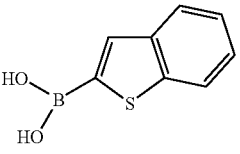 | 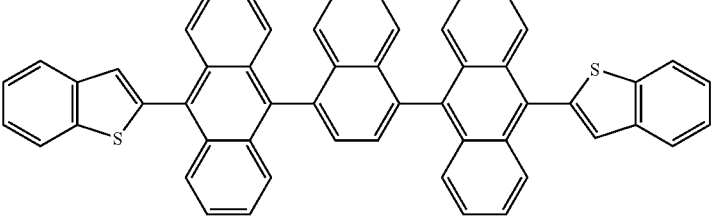 | 71% |
| 11 | 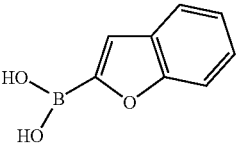 [SMILES: OB(O)c1cc2ccccc2o1] | 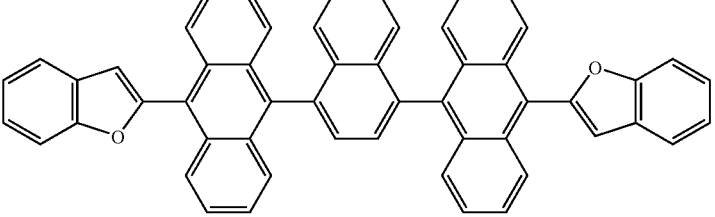 | 68% |
| 12 | 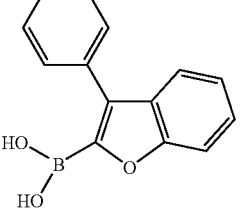 | 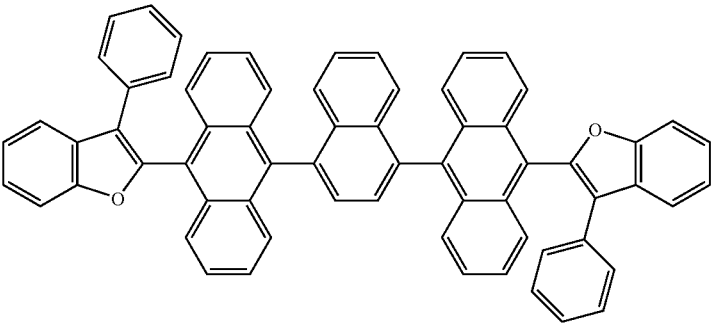 [SMILES: c1ccc(-c2c(-c3c4ccccc4c(-c4ccc(-c5c6ccccc6c(-c6oc7ccccc7c6-c6ccccc6)c6ccccc56)c5ccccc45)c4ccccc34)oc3ccccc23)cc1] | 47% |

-continued

| Ex. | Boronic acid coupling analogously to 1c) | Product | Yield |
|---|---|---|---|
| 13 | HO-B(OH)-(4-pyridyl) | (structure) | 43% |
| 14 | HO-B(OH)-(3-quinolyl) | (structure) | 58% |

*Atropisomer mixture, purity including all isomers

Example 15

Preparation of 4,4'-bis[9-(2-naphthyl)]-10-anthryl-1,1'-dinaphthalene a) Preparation of 4,4'-bis(9-anthryl)-1,1'-dinaphthalene

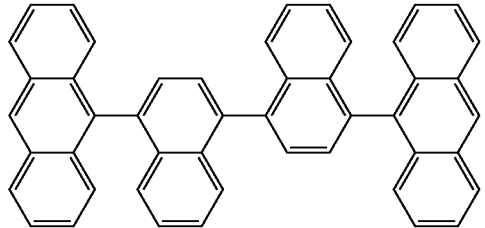 [SMILES: c1ccc2c(-c3ccc(-c4ccc(-c5c6ccccc6cc6ccccc56)c5ccccc45)c4ccccc34)c3ccccc3cc2c1]

22.8 g (90 mmol) of 9-bromoanthracene and 17.7 g (45 mmol) of 1,1'-binaphthyl-4,4'-diboronic acid ethylene glycol ester are initially introduced in 500 ml of toluene and 100 ml of dioxane, 500 ml of 2 M $Na_2CO_3$ solution are added, and the mixture is saturated with nitrogen. 3.2 g (10.7 mmol) of tris-ortho-tolylphosphine and 400 mg (1.8 mmol) of palladium(II) acetate are subsequently added, and the mixture is heated at the boil for 12 h. When the reaction is complete, 500 ml of water are added, the solid is filtered off with suction, washed repeatedly with water and EtOH and dried in vacuo. Filtration and recrystallisation from 1,4-dioxane gives a colourless solid (42.6 g, 78%).

b) Preparation of 4,4'-bis[(10-(9-bromoanthryl)]-1,1'-dinaphthalene

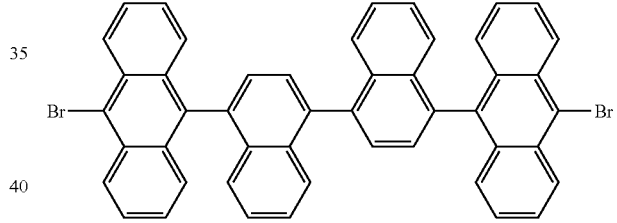

19.7 g (50 mmol) of 4,4'-bis(9-anthryl)-1,1'-dinaphthalene are suspended in 500 ml of dichloromethane, 18.7 g (105 mmol) of NBS are added, and the resultant suspension is stirred at RT for 18 h. The reaction mixture is evaporated in a rotary evaporator, washed by boiling in 500 ml of EtOH/$H_2O$ (1:1) and subsequently recrystallised from dioxane, giving 36.7 g (96%) of a pale-yellow solid having a purity of >98% (RP-HPLC).

c) Preparation of 4,4'-bis[9-(2-naphthyl)-10-anthryl]-1,1'-dinaphthalene

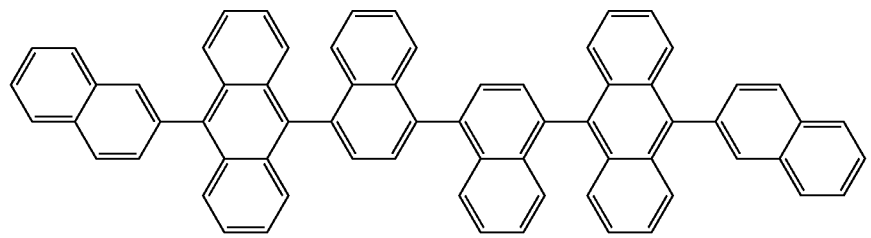 [SMILES: c1ccc2cc(-c3c4ccccc4c(-c4ccc(-c5ccc(-c6c7ccccc7c(-c7ccc8ccccc8c7)c7ccccc67)c6ccccc56)c5ccccc45)c4ccccc34)ccc2c1]

30.6 g (40 mmol) of 1,4-bis[(10-(9-bromoanthryl)]naphthalene and 17.2 g (100 mmol) of naphthalene-2-boronic acid are initially introduced in 500 ml of toluene and 100 ml of dioxane, 500 ml of 2 M $Na_2CO_3$ solution are added, and the mixture is saturated with nitrogen. 3.2 g (10.7 mmol) of tris-ortho-tolylphosphine and 400 mg (1.8 mmol) of palladium(II) acetate are subsequently added, and the mixture is heated at the boil for 12 h. The solid is filtered off, washed with water and ethanol, dissolved in chloroform and filtered. Subsequent recrystallisation from toluene and sublimation- gives a pale-yellow solid which has a purity of >99.9% (determined by RP-HPLC). Yield: 24.4 g (71%). $T_G$=244° C.

Examples 16-28

The following compounds are prepared analogously to Example 15 in the stated yields with a purity of 99.9% according to RP-HPLC starting from the boronic acids mentioned by coupling to the dibromide prepared in 15b) by the process described in 15c).

| Ex. | Boronic acid coupling analogous to 15c) | Product | Yield |
|---|---|---|---|
| 16 | | | 68%* |
| 17 | | | 80% |
| 18 | | | 54%* |
| 19 | | | 79%* |
| 20 | | | 77% |

-continued
| Ex. | Boronic acid coupling analogous to 15c) | Product | Yield |
|---|---|---|---|
| 21 | 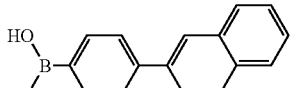 | 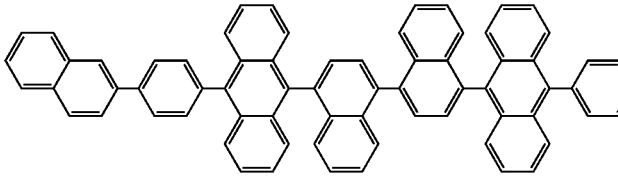 | 76% |
| 22 | 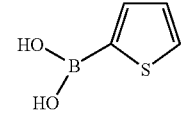 | 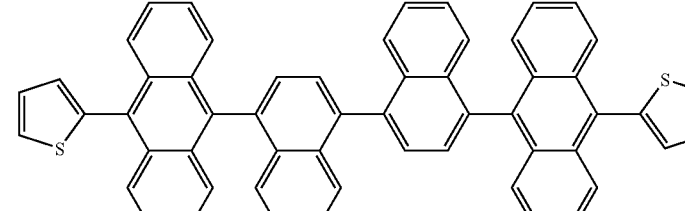 | 81% |
| 23 | 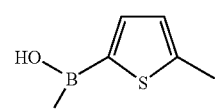 | 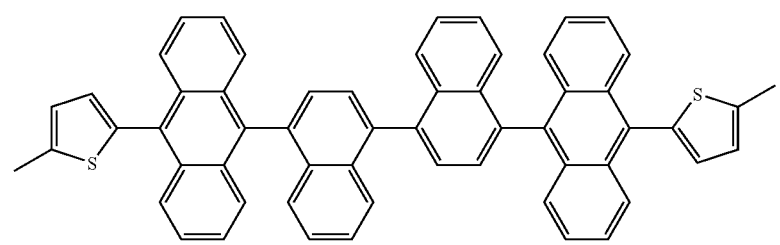 | 60% |
| 24 | 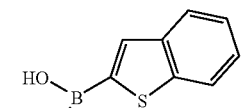 | 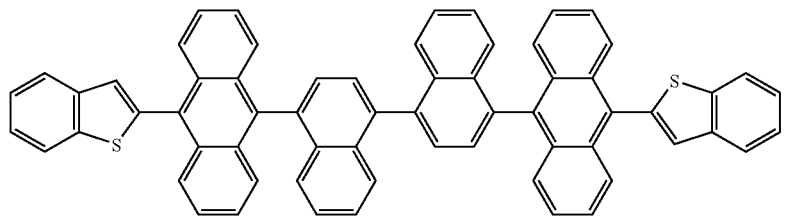 [SMILES: c1ccc2oc(-c3c4ccccc4c(-c4ccc(-c5ccc(-c6c7ccccc7c(-c7cc8ccccc8o7)c7ccccc67)c6ccccc56)c5ccccc45)c4ccccc34)cc2c1] | 75% |
| 25 | 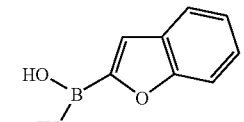 | 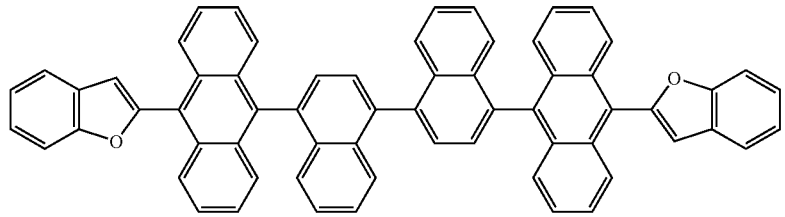 | 63% |
| 26 | 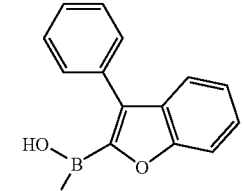 | 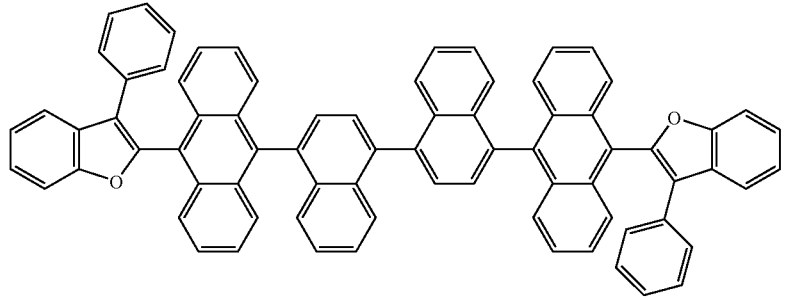 [SMILES: c1ccc(-c2c(-c3c4ccccc4c(-c4ccc(-c5ccc(-c6c7ccccc7c(-c7oc8ccccc8c7-c7ccccc7)c7ccccc67)c6ccccc56)c5ccccc45)c4ccccc34)oc3ccccc23)cc1] | 43% |

-continued

| Ex. | Boronic acid coupling analogous to 15c) | Product | Yield |
|---|---|---|---|
| 27 | 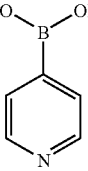 | 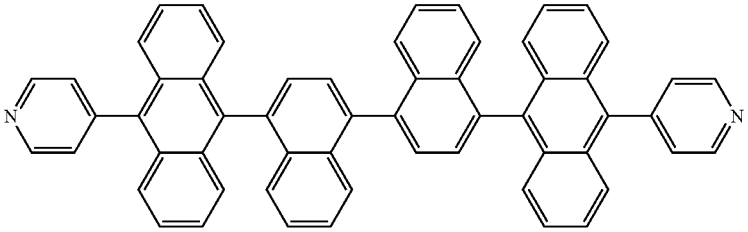 [SMILES: c1ccc2c(-c3c4ccccc4c(-c4ccncc4)c4ccccc34)ccc(-c3ccc(-c4c5ccccc5c(-c5ccncc5)c5ccccc45)c4ccccc34)c2c1] | 51% |
| 28 | 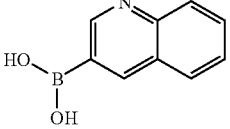 | 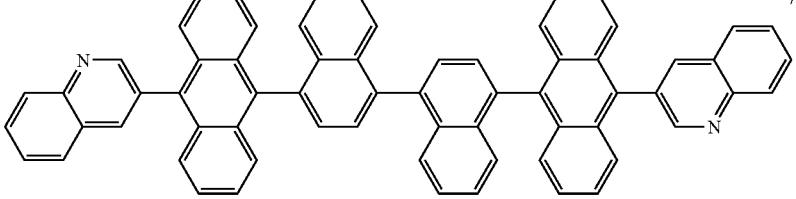 | 74% |

*Atropisomer mixture, purity including all isomers

Examples 29-40

The following compounds are prepared analogously to Example 15 in the stated yields with a purity of 99.9% according to RP-HPLC starting from the boronic acids mentioned by coupling by the process described in 15a), subsequent bromination by the process described in 15b) and subsequent re-coupling to quinoline-3-, pyridine-4-, benzothiophene-2- or benzofuran-2-boronic acid by the process described in 15c).

| Ex. | Boronic acid coupling analogous to 15a) | Product | Yield |
|---|---|---|---|
| 29 | 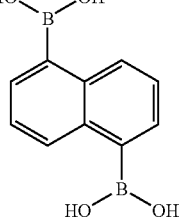 | 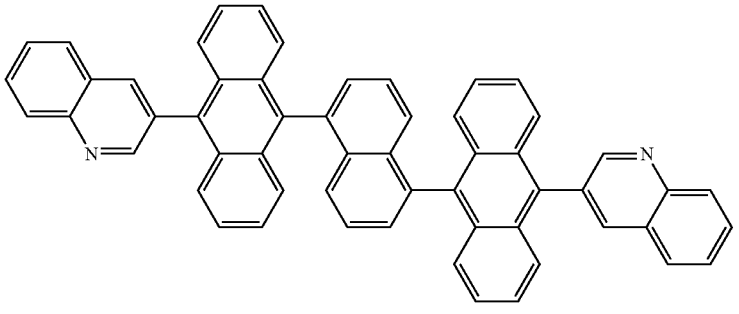 [SMILES: c1ccc2ncc(-c3c4ccccc4c(-c4cccc5c(-c6c7ccccc7c(-c7cnc8ccccc8c7)c7ccccc67)cccc45)c4ccccc34)cc2c1] | 70% |
| 30 | 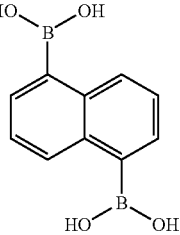 | 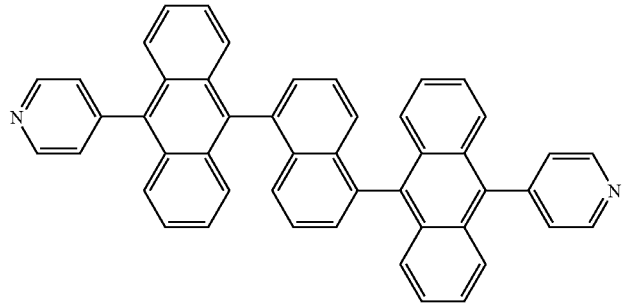 [SMILES: c1cc(-c2c3ccccc3c(-c3ccncc3)c3ccccc23)c2cccc(-c3c4ccccc4c(-c4ccncc4)c4ccccc34)c2c1] | 69% |

-continued

| Ex. | Boronic acid coupling analogous to 15a) | Product | Yield |
|---|---|---|---|
| 31 | 1,5-naphthalenediboronic acid | bis(benzofuran-2-yl)-anthracene-naphthalene-anthracene product | 48% |
| 32 | 1,5-naphthalenediboronic acid | bis(benzothiophen-2-yl)-anthracene-naphthalene-anthracene product | 52% |
| 33 | 2,6-naphthalenediboronic acid | bis(quinolin-3-yl)-anthracene-naphthalene-anthracene product | 64% |
| 34 | phenanthrene-2,7-diboronic acid | bis(quinolin-3-yl)-anthracene-phenanthrene-anthracene product | 83% |
| 35 | 1,4-phenylenediboronic acid | bis(quinolin-3-yl)-anthracene-phenylene-anthracene product | 78% |
| 36 | 4,4'-biphenyldiboronic acid | bis(quinolin-3-yl)-anthracene-biphenyl-anthracene product | 65% |

-continued

| Ex. | Boronic acid coupling analogous to 15a) | Product | Yield |
|---|---|---|---|
| 37 | [structure: 3,3'-biphenyl diboronic acid] | [structure: bis(quinolinyl-anthracenyl) linked by m-biphenylene] | 66% |
| 38 | [structure: 2,2'-biphenyl diboronic acid] | [structure: bis(quinolinyl-anthracenyl) linked by o-biphenylene] | 54% |
| 39 | [structure: 1,6-pyrenediboronic acid] | [structure: bis(quinolinyl-anthracenyl) linked by pyrene] | 43% |
| 40 | [structure: quinoxaline-5,8-diboronic acid] | [structure: bis(naphthyl-anthracenyl) linked by quinoxaline] | 23% |

Example 41

Production of OLEDs

OLEDs are produced by a general process in accordance with WO 04/058911, which is adapted in individual cases to the respective circumstances (for example layer-thickness variation in order to achieve optimum efficiency or colour).

In Examples 42 to 63 below, the results for various OLEDs are presented. Glass plates coated with structured ITO (indium tin oxide) form the substrates of the OLEDs. For improved processing, PEDOT (applied by spin coating from water; purchased from H. C. Starck, Goslar, Germany; poly-(3,4-ethylenedioxy-2,5-thiophene)) is applied to the substrate. The OLEDs consist of the following layer sequence: substrate/PEDOT 20 nm/hole-injection layer (HIL) comprising hole-injection material HIL 20 nm/hole-transport layer (HTM) 20 nm/emission layer (EML) 30 nm/electron-transport layer (ETM) 20 nm and finally a cathode. The materials apart from PEDOT are vapour-deposited thermally in a vacuum chamber.

The emission layer here always consists of a matrix material (host) and a dopant, which is admixed with the host by co-evaporation. The cathode is formed by a 1 nm thin LiF layer and a 150 nm Al layer deposited on top. Table 3 shows the chemical structures of the materials used to build up the OLEDs.

These OLEDs are characterised by standard methods; for this purpose, the electroluminescence spectra, the efficiency (measured in cd/A), the power efficiency (measured in lm/W) as a function of the luminance, calculated from current/voltage/luminance characteristic lines (IUL characteristic lines), and the lifetime are determined. The lifetime is defined as the time after which the initial luminance has dropped from 2000 cd/m² to half.

Table 4 shows the results for some OLEDs (Examples 42 to 63). The host materials according to the invention were the compounds from Examples 1, 6, 10, 13, 14, 16, 19, 35, 37 and 40. The comparative examples used are hosts H1 and H2 in accordance with the prior art.

TABLE 3

HIL1

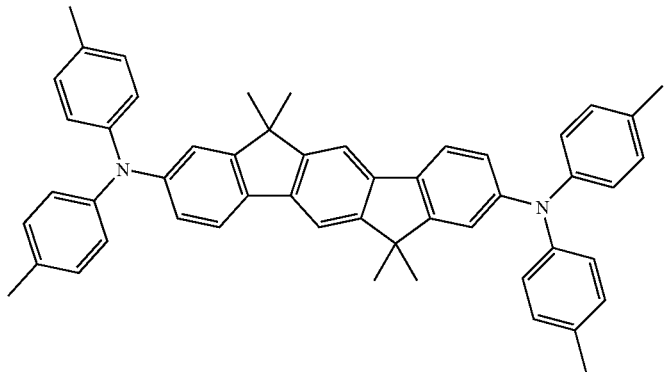

HTM1

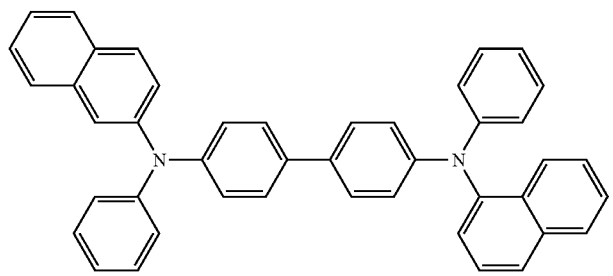 [SMILES: c1ccc(N(c2ccc(-c3ccc(N(c4ccccc4)c4cccc5ccccc45)cc3)cc2)c2ccc3ccccc3c2)cc1]

HTM2

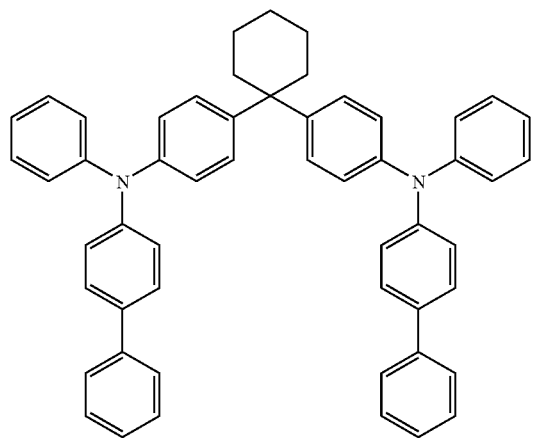 [SMILES: c1ccc(-c2ccc(N(c3ccccc3)c3ccc(C4(c5ccc(N(c6ccccc6)c6ccc(-c7ccccc7)cc6)cc5)CCCCC4)cc3)cc2)cc1]

TABLE 3-continued
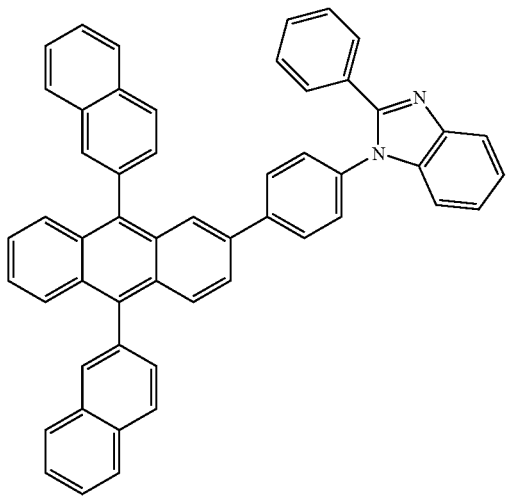 [SMILES: c1ccc(-c2nc3ccccc3n2-c2ccc(-c3ccc4c(-c5ccc6ccccc6c5)c5ccccc5c(-c5ccc6ccccc6c5)c4c3)cc2)cc1]
ETM1
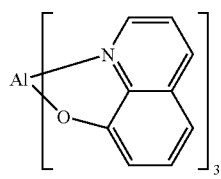
ETM2
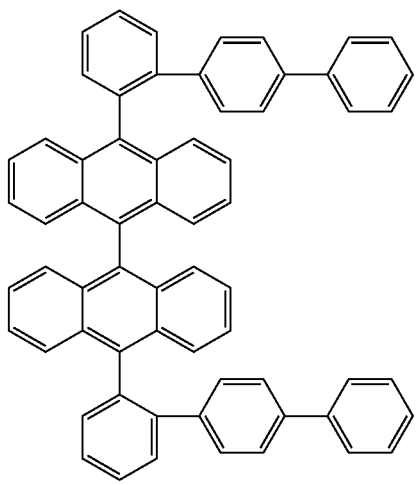 [SMILES: c1ccc(-c2ccc(-c3ccccc3-c3c4ccccc4c(-c4c5ccccc5c(-c5ccccc5-c5ccc(-c6ccccc6)cc5)c5ccccc45)c4ccccc34)cc2)cc1]
Host H1
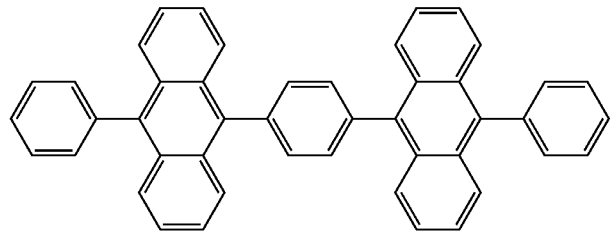 [SMILES: c1ccc(-c2c3ccccc3c(-c3ccc(-c4c5ccccc5c(-c5ccccc5)c5ccccc45)cc3)c3ccccc23)cc1]
Host H2

TABLE 3-continued
Dopant D1
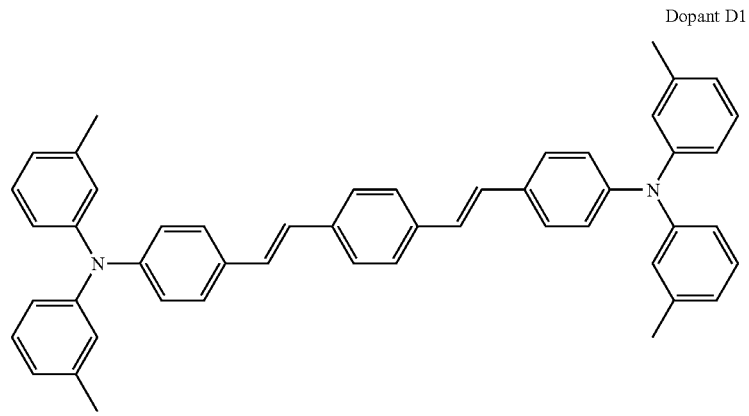
Dopant D2
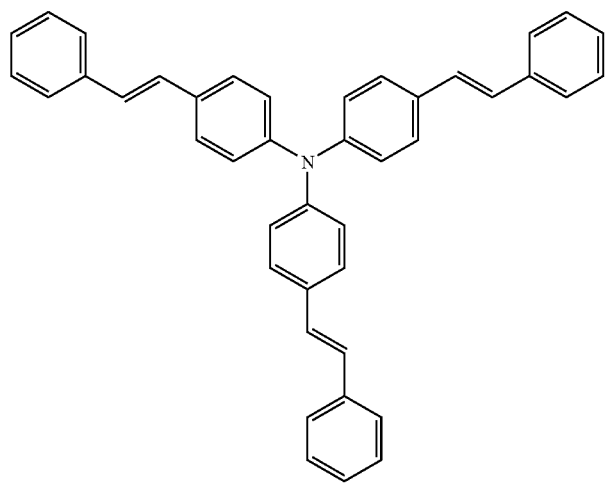 [SMILES: C(=C\c1ccc(N(c2ccc(/C=C/c3ccccc3)cc2)c2ccc(/C=C/c3ccccc3)cc2)cc1)/c1ccccc1]
Dopant D3
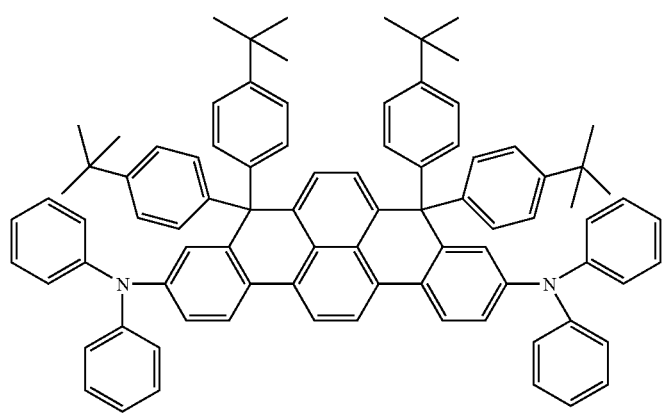 [SMILES: CC(C)(C)c1ccc(C2(c3ccc(C(C)(C)C)cc3)c3cc(N(c4ccccc4)c4ccccc4)ccc3-c3ccc4c5c(ccc2c35)C(c2ccc(C(C)(C)C)cc2)(c2ccc(C(C)(C)C)cc2)c2cc(N(c3ccccc3)c3ccccc3)ccc2-4)cc1]

TABLE 3-continued

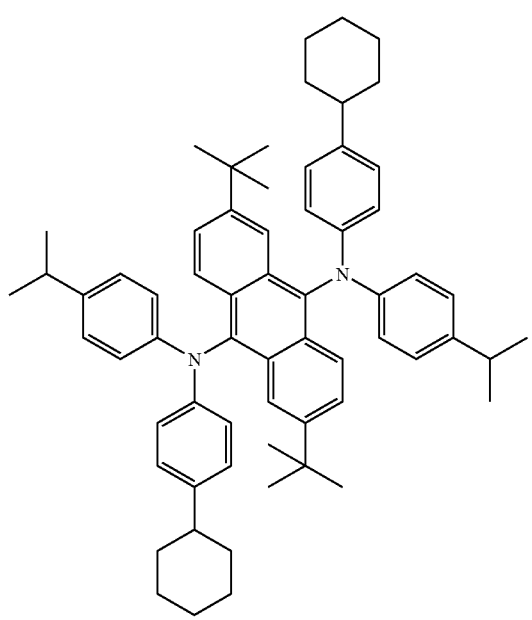 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]

Dopant D4

TABLE 4

| Example | HTM | EML | ETM | Max. efficiency (cd/A) | Voltage (V) at 1000 cd/m$^2$ | CIE | Lifetime at 2000 cd/m$^2$ (h) |
| --- | --- | --- | --- | --- | --- | --- | --- |
| 42 (comparison) | HTM1 | H1 + 5% of D1 | ETM1 | 10.9 | 5.8 | x = 0.17/y = 0.33 | 3200 |
| 43 (comparison) | HTM1 | H2 + 5% of D1 | ETM1 | 11.2 | 5.7 | x = 0.17/y = 0.33 | 2500 |
| 44 (comparison) | HTM1 | H1 + 5% of D2 | ETM1 | 3.6 | 6.3 | x = 0.15/y = 0.13 | 700 |
| 45 (comparison) | HTM2 | H2 + 5% of D2 | ETM1 | 3.2 | 6.5 | x = 0.15/y = 0.17 | 300 |
| 46 (comparison) | HTM2 | H1 + 5% of D3 | ETM2 | 20.4 | 5.4 | x = 0.31/y = 0.63 | 7300 |
| 47 (comparison) | HTM2 | H1 + 5% of D4 | ETM2 | 19.7 | 5.3 | x = 0.28/y = 0.60 | 8500 |
| 48 | HTM1 | Ex. 1 + 5% of D1 | ETM1 | 12.3 | 5.5 | x = 0.17/y = 0.33 | 5100 |
| 49 | HTM1 | Ex. 6 + 5% of D1 | ETM1 | 13.0 | 5.7 | x = 0.17/y = 0.33 | 5800 |
| 50 | HTM1 | Ex. 16 + 5% of D1 | ETM1 | 11.0 | 5.1 | x = 0.17/y = 0.33 | 4900 |
| 51 | HTM1 | Ex. 1 + 5% of D2 | ETM1 | 4.1 | 5.5 | x = 0.15/y = 0.15 | 2100 |
| 52 | HTM1 | Ex. 6 + 5% of D2 | ETM1 | 4.2 | 5.7 | x = 0.15/y = 0.14 | 2500 |
| 53 | HTM1 | Ex. 19 + 5% of D2 | ETM1 | 4.5 | 5.6 | x = 0.15/y = 0.12 | 2800 |
| 54 | HTM2 | Ex. 10 + 5% of D3 | ETM2 | 24.4 | 5.8 | x = 0.30/y = 0.63 | 7000 |
| 55 | HTM2 | Ex. 14 + 5% of D3 | ETM2 | 21.6 | 5.5 | x = 0.30/y = 0.63 | 8100 |
| 56 | HTM2 | Ex. 16 + 5% of D3 | ETM2 | 21.3 | 5.6 | x = 0.31/y = 0.63 | 8800 |
| 57 | HTM2 | Ex. 35 + 5% of D4 | ETM2 | 23.7 | 5.1 | x = 0.28/y = 0.60 | 9000 |
| 58 | HTM2 | Ex. 37 + 5% of D4 | ETM2 | 26.1 | 5.2 | x = 0.29/y = 0.59 | 8700 |
| 59 | HTM2 | Ex. 40 + 5% of D4 | ETM2 | 19.7 | 5.3 | x = 0.28/y = 0.59 | 9300 |
| 60 | HTM2 | Ex. 6 + 5% of D4 | ETM2 | 24.3 | 5.0 | x = 0.31/y = 0.61 | 9100 |
| 61 | HTM2 | Ex. 6 + 5% of D4 | Ex. 14 | 26.4 | 5.2 | x = 0.31/y = 0.62 | 10300 |
| 62 | HTM2 | Ex. 6 + 5% of D4 | Ex. 37 | 25.1 | 5.1 | x = 0.30/y = 0.61 | 11000 |
| 63 | HTM2 | Ex. 6 + 5% of D4 | Ex. 40 | 24.6 | 5.1 | x = 0.30/y = 0.62 | 10800 |

The invention claimed is:

1. An organic electroluminescent device comprising a compound of formula (1)

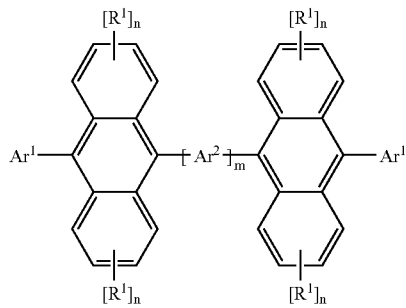

Formula (1)

wherein $Ar^1$ is, identically or differently on each occurrence, either a) an aryl which is a condensed aryl group having 10 to 16 aromatic ring atoms optionally substituted by one or more R', with the proviso that the aryl is substituted by at most one aryl or heteroaryl, or b) an optionally bridged biaryl group, with the proviso that the biaryl group is unsubstituted or substituted with $R^{1''}$ where $R^{1''}$ is identically or differently on each occurrence, H, F, CN, $N(R^2)_2$, a straight-chain alkyl, or alkoxy group having up to 40 C atoms optionally substituted by one or more radicals $R^2$, and wherein one or more H atoms are optionally replaced by F or CN or a branched or cyclic alkyl, alkoxy or thioalkoxy group having 3 to 40 C atoms optionally substituted by one or more radicals $R^2$, or an aryloxy or heteroaryloxy group having 5 to 24 aromatic ring atoms optionally substituted by one or more radicals $R^2$;

$Ar^2$ is 1,4-naphthylene, optionally substituted by one or more radicals $R^1$;

$R^1$ is, identically or differently on each occurrence, H, F, CN, $N(R^2)_2$, a straight-chain alkyl, or alkoxy group having up to 40 C atoms optionally substituted by one or more radicals $R^2$, and wherein one or more H atoms are optionally replaced by F, or CN or a branched or cyclic alkyl, alkoxy or thioalkoxy group having 3 to 40 C atoms optionally substituted by one or more radicals $R^2$,-and wherein one or more H atoms are optionally replaced by F or CN, or an aryl or heteroaryl group having 5 to 30 aromatic ring atoms optionally substituted by one or more radicals $R^2$, or an aryloxy or heteroaryloxy group having 5 to 24 aromatic ring atoms optionally substituted by one or more radicals $R^2$;

$R^2$ is, identically or differently on each occurrence, H or a hydrocarbon radical having up to 20 C atoms, wherein said radical is aliphatic, aromatic or a combination of aliphatic and aromatic, and wherein one or more H atoms are optionally replaced by F;

n is, identically or differently on each occurrence, 0, 1, 2, 3, or 4;

m is 1, and wherein said compound is employed as host material together with a blue emitting dopant.

2. The device of claim 1, wherein $R^1$ is, identically or differently on each occurrence, H, F, a straight-chain alkyl or alkoxy group having up to 6 C atoms, wherein one or more H atoms are optionally replaced by F; a branched or cyclic alkyl or alkoxy group having 3 to 10 C atoms, wherein one or more H atoms are optionally replaced by F; or an aryl or heteroaryl group having 5 to 14 aromatic ring atoms.

3. The device of claim 1, wherein n is 0, 1 or 2.

4. The device of claim 1, wherein n is 0 or 1.

5. The device of claim 1, wherein the two groups $Ar^1$ are identical and identically substituted.

6. The device of claim 1, wherein said device comprises an anode, a cathode, at least one emitting layer, and optionally further layers selected from the group consisting of hole-injection layers, hole-transport layers, electron-transport layers, electron-injection layers, charge-generation layers, and combinations thereof.

7. A process for producing the device of claim 1, comprising applying at least one compound of of formula (1), optionally together with a dopant and/or other compounds, via a sublimation process or from solution or by a printing process.

8. The device as claimed in claim 1, wherein $Ar^1$ which is a condensed aryl group is, identically or differently on each occurrence, 1-naphthyl, 2-naphthyl, 9-anthryl, 2-phenanthrenyl, 9-phenanthrenyl; and $Ar^1$ which is an optionally bridged biaryl group is, identically or differently on each occurrence, an ortho-biphenyl or 2-fluorenyl group.

9. The device as claimed in claim 1, wherein $Ar^1$ which is a condensed aryl group is identically or differently on each occurrence, 1-naphthyl, 2-naphthyl, 9-phenanthrenyl; and $Ar^1$ which is an optionally bridged biaryl group is, identically or differently on each occurrence, an ortho-biphenyl or 2-fluorenyl group.

10. The device of claim 1, wherein $R^1$ identically or differently on each occurrence, is H, F, a straight-chain alkyl or alkoxy group having up to 6 C atoms, wherein one or more H atoms are optionally replaced by F; a branched or cyclic alkyl or alkoxy group having 3 to 10 C atoms, wherein one or more H atoms are optionally replaced by F.

11. The device as claimed in claim 1, wherein $R^1$ is, identically or differently on each occurrence, H, F, straight-chain alkyl groups having 1 to 4 C atoms, branched alkyl groups having 3 to 5 C atoms or cyclic alkyl groups having 5 to 10 C atoms, where in each case one or more H atoms may be replaced by F, or aryl or heteroaryl groups having 6 to 10 aromatic ring atoms.

12. The device of claim 1, wherein m is 1 and n is 0 or 1.

* * * * *